(12) United States Patent
Ishimaru

(10) Patent No.: US 10,795,251 B2
(45) Date of Patent: Oct. 6, 2020

(54) LIGHT EMISSION CONTROL DEVICE, LIGHT SOURCE DEVICE, AND PROJECTION TYPE VIDEO DISPLAY DEVICE

(71) Applicant: SEIKO EPSON CORPORATION, Tokyo (JP)

(72) Inventor: Kei Ishimaru, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/794,353

(22) Filed: Feb. 19, 2020

(65) Prior Publication Data

US 2020/0264501 A1 Aug. 20, 2020

(30) Foreign Application Priority Data

Feb. 20, 2019 (JP) .................................. 2019-028235

(51) Int. Cl.
| | |
|---|---|
| H05B 45/00 | (2020.01) |
| G03B 21/20 | (2006.01) |
| H01S 5/042 | (2006.01) |
| H01S 5/40 | (2006.01) |

(52) U.S. Cl.
CPC ..... *G03B 21/2053* (2013.01); *G03B 21/2013* (2013.01); *G03B 21/2033* (2013.01); *H01S 5/0427* (2013.01); *H01S 5/0428* (2013.01); *H01S 5/4025* (2013.01)

(58) Field of Classification Search
CPC ........ H05B 45/00; H05B 45/10; H05B 45/20; H05B 45/30; H05B 45/32; H05B 45/325; H05B 45/327; H05B 47/00; H05B 47/10; H05B 47/20; G03B 21/2053; G03B 21/2033; G03B 21/2013; H01S 5/0428; H01S 5/0427; H01S 5/0425
See application file for complete search history.

(56) References Cited

U.S. PATENT DOCUMENTS

| | | |
|---|---|---|
| 2013/0250215 A1 | 9/2013 | Sasaki et al. |
| 2018/0180978 A1 | 6/2018 | Yamada et al. |
| 2019/0037659 A1* | 1/2019 | Chen ...................... H05B 45/37 |

FOREIGN PATENT DOCUMENTS

JP 2012-124003 A 6/2012

* cited by examiner

*Primary Examiner* — Jimmy T Vu
(74) *Attorney, Agent, or Firm* — Oliff PLC

(57) ABSTRACT

The light emission control device includes a PWM terminal to which a PWM signal is input, a first drive circuit for outputting a first control signal, a second drive circuit for outputting a second control signal, and a mode judgment circuit. The first control signal sets the first switching element to an ON state when the PWM signal is in an active state, and sets the first switching element to an OFF state when the PWM signal is in an inactive state. The second control signal controls an ON/OFF state of the second switching element when the PWM signal is in the active state. The mode judgment circuit judges between a PWM dimming mode and an analog dimming mode based on the PWM signal.

15 Claims, 17 Drawing Sheets

| DUTY RATIO | 1%≦DUTY RATIO<10% | 10%≦DUTY RATIO<100% | 100% |
|---|---|---|---|
| DIMMING MODE | PWM | PWM | ANALOG |
| AMOD1 | L | L | H |
| SHMOD1 | H | L | L |
| CURRENT DETECTION CIRCUIT | WITH S/H | WITHOUT S/H | WITHOUT S/H |
| MASK | DISABLED | ENABLED | — |
| GATE ELONGATION | ENABLED | DISABLED | DISABLED |

| AMOD1 | L | | H | |
|---|---|---|---|---|
| AMOD2 | L | H | L | H |
| CLK2' | CLK2 | | | $\overline{\text{CLK1}}$ |

# LIGHT EMISSION CONTROL DEVICE, LIGHT SOURCE DEVICE, AND PROJECTION TYPE VIDEO DISPLAY DEVICE The present application is based on, and claims priority from JP Application Serial Number 2019-028235, filed Feb. 20, 2019, the disclosure of which is hereby incorporated by reference herein in its entirety.

BACKGROUND

1. Technical Field

The present disclosure relates to a light emission control device, a light source device, a projection type video display device, and so on.

2. Related Art

There has been known a light emission control device for controlling a light source used in, for example, a projector. The light emission control device controls an amount of light emitted from a light emitting element based on a PWM signal and a dimming control voltage supplied from an external processing device. As a dimming mode, there are cited an analog dimming mode in which the amount of light emitted is controlled by a voltage value of the dimming control voltage, and a PWM dimming mode in which the amount of light emitted is controlled by a pulse width of the PWM signal. Dimming is performed in the analog dimming mode from a maximum luminance level to a predetermined luminance level, and is performed in the PWM dimming mode in a range lower than the predetermined luminance level. Such related art of the light emission control device is disclosed in, for example, the specification of US-2018/0180978-A1 (Document 1). Further, in Document 1, there is described the fact that the light emission control device has a plurality of operation modes in the PWM dimming mode. The plurality of operation modes includes, for example, an operation mode of a current detection device for detecting a current flowing through the light emitting element.

In the light emission control device described above, when trying to control an internal operation in accordance with the dimming mode or the operation mode, a mode signal representing the dimming mode or the operation mode becomes necessary. The external processing device is supplying the PWM signal and the dimming control voltage to the light emission control device, and can therefore figure out the dimming mode or the operation mode. Therefore, it is possible to input a mode sitting signal from the external processing device to the light emission control device. However, it is necessary to provide a terminal for receiving the mode signal to the light emission control device, and there is a problem that the number of terminals or a circuit size increases.

SUMMARY

An aspect of the present disclosure relates to a light emission control device configured to control a first switching element disposed in series to a light emitting element between a first power supply node and one end of an inductor, and a second switching element disposed between another end of the inductor and a second power supply node, the light emission control device including a PWM terminal to which a PWM signal is input, a first drive circuit configured to output a first control signal for setting the first switching element to an ON state when the PWM signal is in an active state, and setting the first switching element to an OFF state when the PWM signal is in an inactive state, a second drive circuit configured to output a second control signal for controlling an ON/OFF state of the second switching element when the PWM signal is in the active state, and a mode judgment circuit configured to judge between a PWM dimming mode as a dimming mode using the first control signal, and an analog dimming mode as a dimming mode using the second control signal based on the PWM signal.

DESCRIPTION OF AN EXEMPLARY EMBODIMENT

A preferred embodiment of the present disclosure will hereinafter be described in detail. It should be noted that the embodiment described hereinafter does not unreasonably limit the content of the present disclosure as set forth in the appended claims, and all of the constituents described in the present embodiment are not necessarily essential constituents.

1. Light Source Device, Light Emission Control Device

Figure 1:
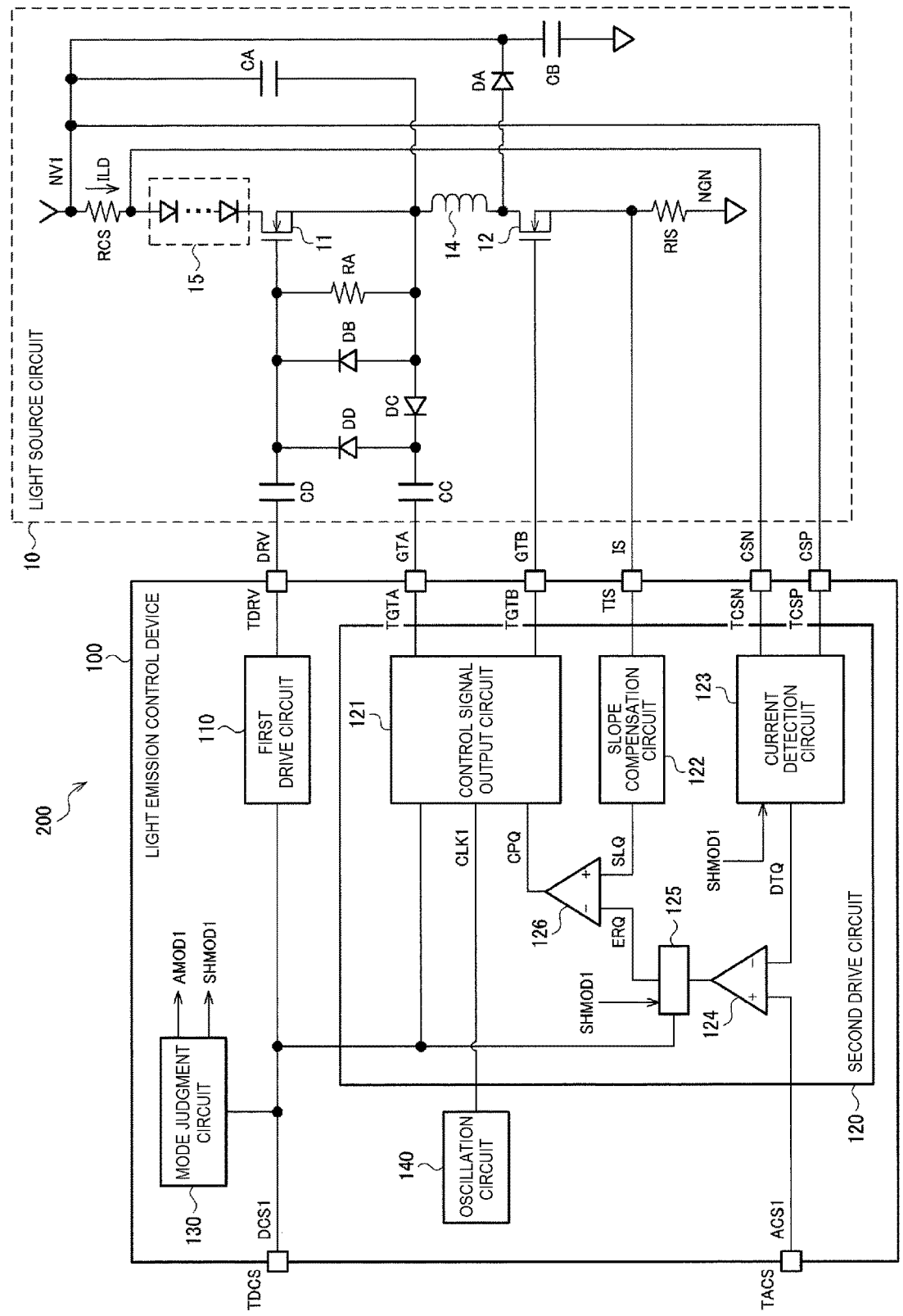
FIG. 1 is a diagram showing a first configuration example of a light source device.

FIG. 1 shows a first configuration example of a light source device 200. The light source device 200 includes alight source circuit 10 as a light emitting element and a peripheral circuit of the light emitting element, and a light emission control device 100 for controlling the light emission of the light emitting element. The light emission control device 100 is, for example, an integrated circuit device, and is realized by, for example, a semiconductor chip.

Figure 2:
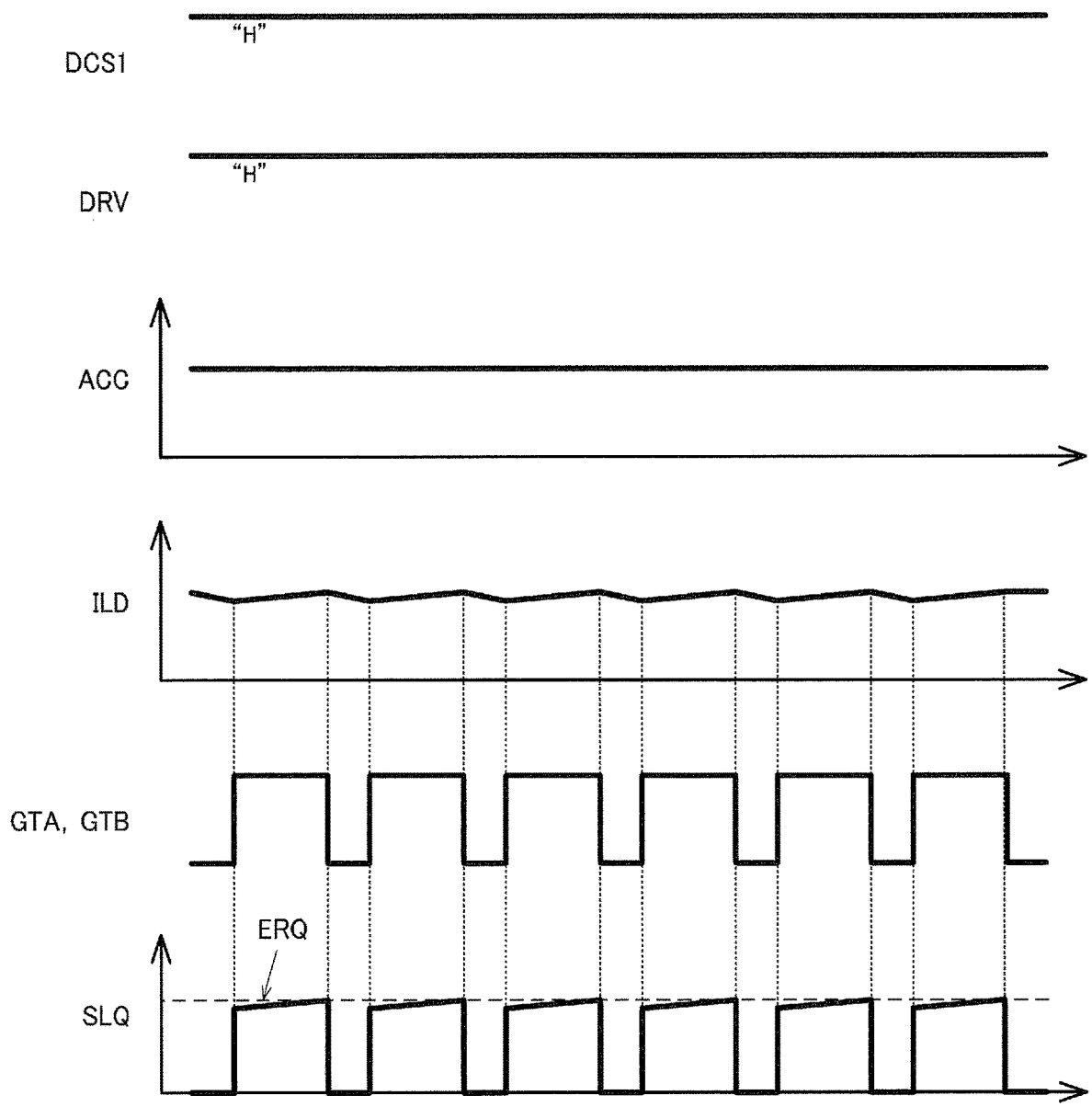
FIG. 2 is a waveform chart in an analog dimming mode.
Figure 3:
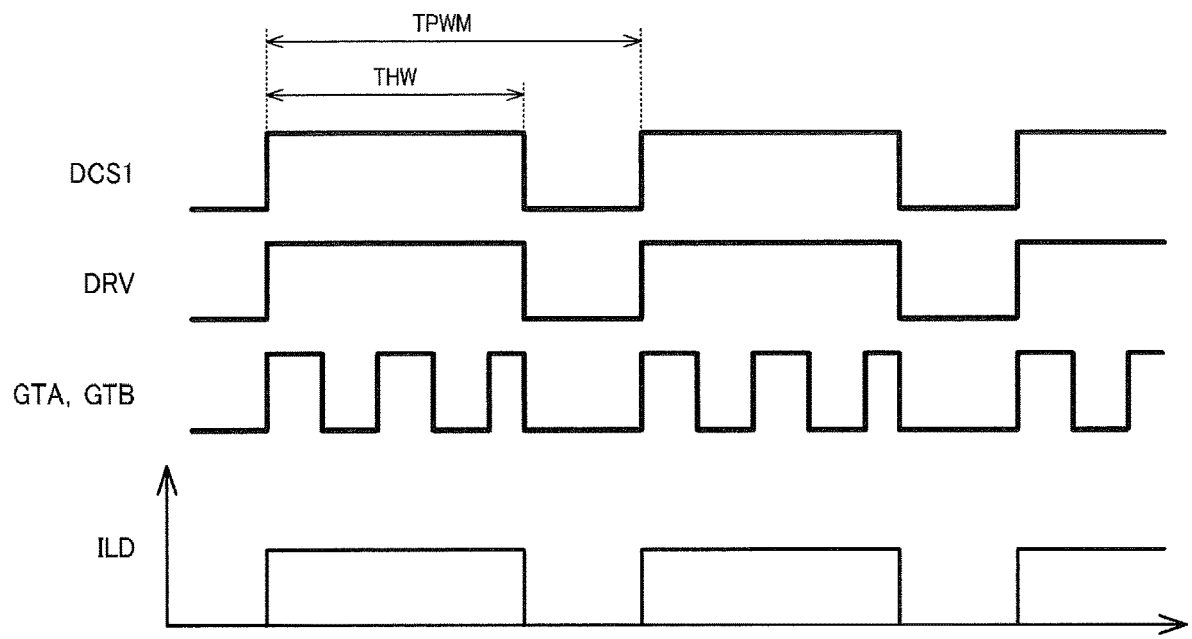
FIG. 3 is a first waveform chart in a PWM dimming mode.
Figure 4:
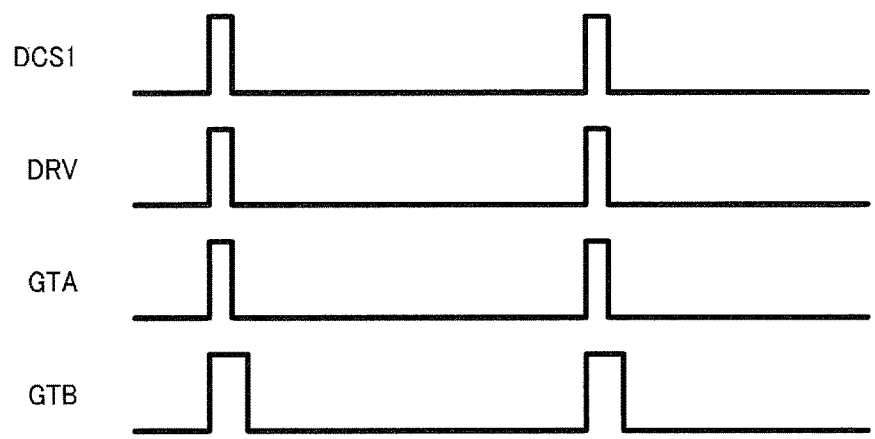
FIG. 4 is a second waveform chart in the PWM dimming mode.

Firstly, the configuration of the light source circuit 10 and the light emission control device 100 is described using FIG. 1, and a PWM dimming mode and an analog dimming mode are described using FIG. 2 through FIG. 4. Then, a mode judgment will be described using FIG. 5 and subsequent drawings.

As shown in FIG. 1, the light source circuit 10 includes a first switching element 11, a second switching element 12, an inductor 14, and a light emitting element 15. Further, the light source circuit 10 includes a first resistor RCS, resistors RIS, RA, capacitors CA through CD, and diodes DA through DD. It should be noted that although FIG. 1 illustrates when the first switching element 11 and the second switching element 12 are each an N-type transistor, these switching elements are not limited to the N-type transistor.

The light emitting element 15 is driven by a current ILD and emits light with the luminance corresponding to the current value of the current ILD. The light emitting element 15 is formed of a plurality of laser diodes connected in series to each other. It should be noted that the light emitting element 15 can be a single laser diode, or can also be an LED (Light Emitting Diode).

The light emitting element 15 and the first switching element 11 are disposed in series between a first power supply node NV1 and one end of the inductor 14. The second switching element 12 is disposed between the other end of the inductor 14 and a second power supply node NGN. Specifically, the first resistor RCS is coupled between the first power supply node NV1 and one end of the light emitting element 15, the other end of the light emitting element 15 is coupled to a drain of the first switching element 11, and a source of the first switching element 11 is coupled to the one end of the inductor 14. The other end of the inductor 14 is coupled to a drain of the second switching element 12, and the resistor RIS is coupled between a source of the second switching element 12 and the second power supply node NGN. The first power supply node NV1 is a node to which a first power supply is input, and the second power supply node NGN is a node to which a second power supply is input. The first power supply is higher in voltage than the second power supply. The second power supply is, for example, the ground. It should be noted that the connection relationship between the resistor RA, the capacitors CA through CD, and the diodes DA through DD is as illustrated in FIG. 1, and the operation of the light source circuit 10 including these circuit elements will be described later with reference to FIG. 2 through FIG. 4.

The second switching element 12 performs switching regulation control on the current flowing through the inductor 14. The first switching element 11 controls whether to allow the current flowing through the inductor 14 to flow into the light emitting element 15. Although described later in detail, the mode in which the first switching element 11 is always set to the ON state, and the amount of light emitted by the light emitting element 15 is controlled using the switching regulation control by the second switching element 12 is called an analog dimming mode. Further, the mode in which the first switching element 11 is switched ON and OFF, and the amount of light emitted by the light emitting element 15 is controlled using the on-duty ratio of the first switching element 11 is called a PWM dimming mode.

The light emission control device 100 includes a PWM terminal TDCS, a first drive circuit 110, a second drive circuit 120, and a mode judgment circuit 130. Further, the light emission control device 100 includes an oscillation circuit 140, a dimming voltage input terminal TACS, and terminals TDRV, TGTA, TGTB, TIS, TCSP, and TCSN.

A PWM signal DCS1 to be used for the dimming control in the PWM dimming mode is input to the PWM terminal TDCS from the processing device. A dimming voltage ACS1 to be used for the dimming control in the analog dimming mode is input to the dimming voltage input terminal TACS from the processing device. The processing device is a host device of the light emission control device 100, and is a processor such as an MPU or a CPU.

The first drive circuit 110 outputs, based on the PWM signal DCS1, a first control signal DRV for controlling the first switching element 11 to be switched ON or OFF. The first control signal DRV is output from the terminal TDRV, and is input to the gate of the first switching element 11 via the capacitor CD. The first drive circuit 110 outputs the first control signal DRV for setting the first switching element 11 to the ON state when the PWM signal DCS1 is active, and outputs the first control signal DRV for setting the first switching element 11 to the OFF state when the PWM signal DCS1 is inactive. The first drive circuit 110 is formed of, for example, a buffer circuit for buffering the PWM signal DCS1.

The oscillation circuit 140 generates a clock signal CLK1. The oscillation circuit 140 is, for example, a CR oscillation circuit, a ring oscillator, or a multivibrator.

The second drive circuit 120 outputs a second control signal GTB based on the dimming voltage ACS1, the PWM signal DCS1, and the clock signal CLK1. The second control signal GTB is output from the terminal TGTB, and is then input to the gate of the second switching element 12. The second control signal GTB controls the ON/OFF state of the second switching element 12 in the period in which the PWM signal DCS1 is active. Specifically, the voltage CSP of one end of the first resistor RCS is input to the terminal TCSP, the voltage CSN of the other end of the first resistor RCS is input to the terminal TCSN, and the voltage IS of one end of the resistor RIS is input to the terminal TIS. The second drive circuit 120 performs the switching regulation control on the current ILD flowing through the light emitting element 15 based on the voltages CSP, CSN, and IS and the dimming voltage ACS1 to thereby control the current ILD to correspond to the dimming voltage ACS1.

Further, the second drive circuit 120 outputs a control signal GTA for helping the operation of the first switching element 11. The control signal GTA is basically the same as the second control signal GTB, but is different from the second control signal GTB in some cases as described later. It should be noted that it is also possible to input the control signal GTA to the gate of the second switching element 12 as the second control signal. In this case, the terminal TGTB is omitted.

The second drive circuit 120 includes a control signal output circuit 121, a slope compensation circuit 122, a current detection circuit 123, an error amplifier circuit 124, a switch circuit 125, and a comparator 126. The operations of the constituents of the second drive circuit 120 and the first drive circuit 110 in the respective dimming modes will hereinafter be described using the waveform charts shown in FIG. 2 through FIG. 4. It should be noted that hereinafter an active level is defined as a high level, and an inactive level is defined as a low level.

FIG. 2 is a waveform chart in the analog dimming mode. In the analog dimming mode, the PWM signal DCS1 is in the high level. The first drive circuit 110 outputs the first control signal DRV in the high level to thereby always set the first switching element 11 to the ON state. It should be noted that in the PWM dimming mode, the PWM signal DCS1 is a rectangular wave having the duty ratio of the high level smaller than 100%. Therefore, the PWM signal DCS1 always in the high level in the analog dimming mode is defined as the PWM signal with the duty ratio of the high level equal to 100%.

The current detection circuit 123 multiplies the potential difference CSP−CSN=RCS×ILD between the both ends of the first resistor RCS by a given gain to thereby output a detection voltage DTQ. The error amplifier circuit 124 amplifies an error between the detection voltage DTQ and the dimming voltage ACS1. The switch circuit 125 is in the ON state when the PWM signal DCS1 is in the high level, and is in the OFF state when the PWM signal DCS1 is in the low level. In the analog dimming mode, the switch circuit 125 is always in the ON state.

In order to suppress the subharmonic oscillation of the laser diodes, the slope compensation circuit 122 increases the slope in the temporal change of the voltage IS, and then outputs the voltage SLQ having increased in the slope. The comparator 126 compares the voltage SLQ and the output voltage ERQ of the error amplifier circuit 124 with each other, and outputs the signal CPQ in the low level when SLQ<ERQ is true, and outputs the signal CPQ in the high level when SLQ>ERQ is true.

The control signal output circuit 121 makes the transition of the second control signal GTB from the low level to the high level with the edge of the clock signal CLK1. When the second control signal GTB is in the high level, since the second switching element 12 is in the ON state, a current flows from the inductor 14 to the second power supply node NGN via the second switching element 12 and the resistor RIS. Since the current flowing through the inductor 14 increases, the voltage IS rises, and the output voltage SLQ of the slope compensation circuit 122 rises. Since the current flowing through the inductor 14 flows into the light emitting element 15 via the first switching element 11, the current ILD flowing through the light emitting element 15 also increases.

When SLQ>ERQ is reached, the output signal CPQ of the comparator 126 makes the transition from the low level to the high level. On this occasion, the control signal output circuit 121 makes the transition of the second control signal GTB from the high level to the low level. When the second control signal GTB is in the low level, since the second switching element 12 is in the OFF state, a current flows from the inductor 14 into the first power supply node NV1 via the diode DA. Since the current flowing through the inductor 14 decreases, the current ILD flowing through the light emitting element 15 also decreases.

When the detection voltage DTQ as a detection result of the current ILD and the dimming voltage ACS1 are different from each other, since the output voltage ERQ of the error amplifier circuit 124 changes, the duty ratio of the second control signal GTB changes. Thus, feedback control is performed on the current ILD so that the detection voltage DTQ coincides with the dimming voltage ACS1. Due to such feedback control, the current ILD is kept constant. The control of keeping the current ILD constant is called switching regulation control. The current ILD is kept in the current value corresponding to the dimming voltage ACS1, and when the processing device changes the dimming voltage ACS1, the current ILD changes accordingly. In other words, in the analog dimming mode, the amount of light emitted by the light emitting element 15 is controlled by the dimming voltage ACS1.

The control signal GTA will be described. In the analog dimming mode, the control signal GTA is the same in waveform as the second control signal GTB. Between the gate and the source of the first switching element 11, there are coupled the diode DB and the resistor RA as protective elements. Since DC cut of the first control signal DRV is achieved by the capacitor CD, the gate-source voltage of the first switching element 11 gradually drops via the resistor RA. Therefore, in order to keep the gate-source voltage, the control signal GTA is output.

Specifically, the control signal GTA is input to one end of the capacitor CC. When the control signal GTA is in the low level, the voltage of the other end of the capacitor CC becomes the source voltage of the first switching element via the diode DC. It is assumed that the potential difference when the control signal GTA makes the transition from the low level to the high level is called a transition voltage. When the control signal GTA has made the transition from the low level to the high level, since the voltage of the other end of the capacitor CC rises as much as the transition voltage, the voltage is supplied to the gate of the first switching element 11 via the diode DD. Thus, the gate-source voltage of the first switching element 11 becomes the transition voltage, and therefore, the voltage drop due to the resistor RA is compensated. It should be noted that in the above description, the voltage drop by the diode is disregarded.

The analog dimming mode described above is used in a range of the current ILD from the maximum value to a predetermined value. In other words, the analog dimming mode is used when making the light emitting element 15 emit light with high luminance. In contrast, when the current ILD is smaller than the predetermined value, namely when making the light emitting element 15 emit light with low luminance, the PWM dimming mode is used.

FIG. 3 is a first waveform chart in the PWM dimming mode. The cycle length of the PWM signal DCS1 is denoted by TPWM, and the period in which the PWM signal DCS1 is in the high level is denoted by THW. The duty ratio of the PWM signal DCS1 is (THW/TPWM)×100%. It should be noted that the frequency of the second control signal GTB is set higher than the frequency of the PWM signal DCS1.

When the PWM signal DCS1 is in the high level, the first drive circuit 110 outputs the first control signal DRV in the high level to thereby set the first switching element 11 to the ON state. On this occasion, by the second drive circuit 120 switching the second control signal GTB, the switching regulation control is performed. Thus, the current ILD corresponding to the dimming voltage ACS1 flows through the light emitting element 15. When the PWM signal DCS1 is in the low level, the first drive circuit 110 outputs the first control signal DRV in the low level to thereby set the first switching element 11 to the OFF state. Further, the second drive circuit 120 set the second control signal GTB to the low level. On this occasion, no current flows through the light emitting element 15.

Since the time average of the current ILD flowing through the light emitting element 15 is determined by the duty ratio of the PWM signal DCS1, the amount of light emitted is also determined by the duty ratio of the PWM signal DCS1. As described above, in the PWM dimming mode, the dimming control is performed using the duty ratio of the PWM signal DCS1. In contrast, as the current value when the current ILD flows through the light emitting element 15, a current value higher than the time average is ensured. In order to make the laser diodes emit light, it is necessary to make the current ILD higher than a threshold value flow through the laser diodes. It is arranged that it is possible to make the current ILD higher than the threshold value flow through the laser diodes to thereby make the laser diodes emit light, and at the same time, to perform dimming as the time average by performing such PWM control as described above.

It should be noted that when the PWM signal DCS1 has a high duty ratio higher than the predetermined duty ratio, the second drive circuit 120 outputs the control signal GTA the same in waveform as the second control signal GTB.

FIG. 4 is a second waveform chart in the PWM dimming mode. FIG. 4 shows a waveform chart when the PWM signal DCS1 has a low duty ratio lower than the predetermined duty ratio.

When the PWM signal DCS1 has the low duty ratio, the second control signal GTB and the control signal GTA are different in waveform from each other. Specifically, the second drive circuit 120 sets the control signal GTA to the low level when the PWM signal DCS1 changes from the high level to the low level. In contrast, the second drive circuit 120 keeps the second control signal GTB in the high level for a predetermined period after the PWM signal DCS1 has changed from the high level to the low level, and then sets the second control signal GTB to the low level.

When the PWM signal DCS1 has the low duty ratio, since the time during which the second switching element 12 makes the current flow through the inductor 14 becomes shorter, there is a possibility that only a lower current than the current corresponding to the duty ratio can be made to flow through the inductor 14. Therefore, the ON period of the second switching element 12 is elongated. In contrast, in order to surely set the first switching element 11 to the OFF state when the PWM signal DCS1 is in the low level, the control signal GTA is set to the low level in accordance with the PWM signal DCS1.

2. Mode Judgment Circuit

Figures 5, 6:
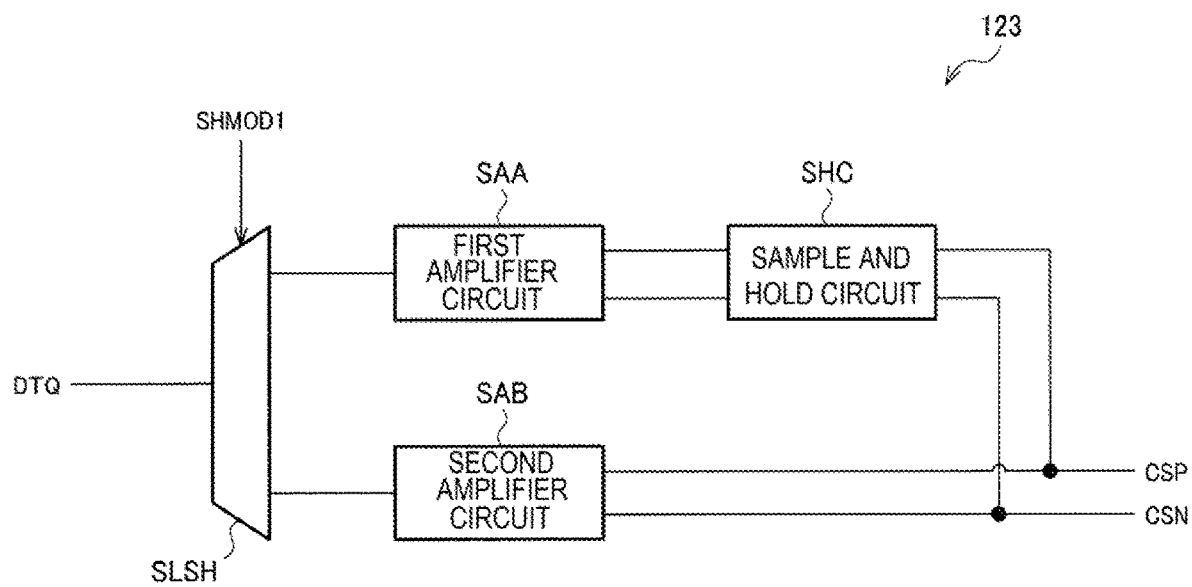
FIG. 5 is a diagram for explaining an operation of a mode judgment circuit and an operation of a light emission control device in each mode.
FIG. 6 is a diagram showing a detailed configuration example of a current detection circuit.

FIG. 5 is a diagram for explaining an operation of the mode judgment circuit 130 and an operation of the light emission control device 100 in each mode.

The mode judgment circuit 130 judges between the PWM dimming mode as the dimming mode using the first control signal DRV, and the analog dimming mode as the dimming mode using the second control signal GTB based on the PWM signal DCS1. Specifically, the mode judgment circuit 130 judges the length of the active period or the duty ratio of the PWM signal DCS1 to thereby judge between the PWM dimming mode and the analog dimming mode. It should be noted that since the proportion of the length of the active period to the cycle length of the PWM signal DCS1 corresponds to the duty ratio, by detecting the length of the active period, the duty ratio is virtually detected.

As described above, by judging the dimming mode based on the PWM signal DCS1 input from the processing device to the PWM terminal TDCS, it is possible to judge the dimming mode inside the light emission control device 100 without receiving the mode signal from the outside. Thus, it is possible to know the dimming mode without increasing the number of terminals or the circuit size.

Further, the light emission control device 100 has a plurality of operation modes corresponding to the duty ratio of the PWM signal DCS1 in the PWM dimming mode. The mode judgment circuit 130 judges the duty ratio of the PWM signal DCS1 to thereby judge what operation mode is currently set out of the plurality of operation modes. Alternatively, the light emission control device 100 has a plurality of operation modes corresponding to the length of the active period of the PWM signal DCS1 in the PWM dimming mode. It is also possible for the mode judgment circuit 130 to judge the length of the active period of the PWM signal DCS1 to thereby judge what operation mode is currently set out of the plurality of operation modes.

As described above, by judging the operation mode of the light emission control device 100 based on the PWM signal DCS1 input from the processing device to the PWM terminal TDCS, it is possible to judge the operation mode inside the light emission control device 100 without receiving the mode signal from the outside. Thus, it is possible to know the operation mode without increasing the number of terminals or the circuit size.

More specifically, as shown in FIG. 5, the mode judgment circuit 130 outputs a dimming mode judgment signal AMOD1 and a duty ratio judgment signal SHMOD1 based on the PWM signal DCS1. When the duty ratio of the PWM signal DCS1 is no lower than 1% and lower than 100%, the mode judgment circuit 130 judges that the PWM dimming mode is currently set, and outputs AMOD1=L. When the duty ratio of the PWM signal DCS1 is 100%, the mode judgment circuit 130 judges that the analog dimming mode is currently set, and outputs AMOD1=H. The character L denotes the low level, and the character H denotes the high level. Further, when the duty ratio of the PWM signal DCS1 is no lower than 1% and lower than 10%, the mode judgment circuit 130 judges that the low duty mode is currently set, and outputs SHMOD1=H. When the duty ratio of the PWM signal DCS1 is no lower than 10% and no higher than 100%, the mode judgment circuit 130 judges that the high duty mode is currently set, and outputs SHMOD1=L.

It should be noted that although in FIG. 5, the judgment threshold value between the low duty mode and the high duty mode is set to 10%, it is also possible to adopt the judgment threshold value other than 10%. Further, the threshold values for enabling/disabling a sample and hold function, enabling/disabling a making operation, and enabling/disabling gate elongation are the same in FIG. 5, but can also be different from each other.

Firstly, an example of the operation control using SHMOD1 will be described using FIG. 5. It should be noted that an example of the operation control using AMOD1 will be described later.

As shown in FIG. 5, the current detection circuit 123 operates in a first operation mode in which the sample and hold function is enabled when SHMOD1=H is true, and operates in a second operation mode in which the sample and hold function is disabled when SHMOD1=L is true.

Further, the second drive circuit 120 operates in a first operation mode in which the masking operation is enabled when SHMOD1=H is true, and operates in a second operation mode in which the masking function is disabled when SHMOD1=L is true. The masking operation is to mask the detection result of the current detection circuit 123 in a masking period after the PWM signal DCS1 has changed from the inactive state to the active state.

Further, the control signal output circuit 121 operates in a first operation mode in which the gate elongation is enabled when SHMOD1=H is true, and operates in a second operation mode in which the gate elongation is disabled when SHMOD1=L is true. The gate elongation is to elongate the ON period of the second switching element 12 as described with reference to FIG. 4.

The operation modes described above will hereinafter be described in detail. Firstly, the operation modes of the current detection circuit 123 will be described. FIG. 6 shows a detailed configuration example of the current detection circuit 123. The current detection circuit 123 includes a first amplifier circuit SAA, a second amplifier circuit SAB, a sample and hold circuit SHC, and a switch circuit SLSH.

The sample and hold circuit SHC samples and holds the potential difference (CSP–CSN) between the both ends of the first resistor RCS. Specifically, the sample and hold circuit SHC samples and holds the potential difference (CSP–CSN) immediately before the first switching element 11 is switched OFF, namely immediately before the transition of the first control signal DRV from the high level to the low level is made. For example, the sample and hold circuit SHC is formed of a switched capacitor circuit, and the switched capacitor circuit samples and holds the potential difference (CSP–CSN).

The first amplifier circuit SAA is a current sensing amplifier circuit. The first amplifier circuit SAA amplifies the potential difference held by the sample and hold circuit SHC with a predetermined gain.

The second amplifier circuit SAB is a current sensing amplifier circuit. The second amplifier circuit SAB amplifies the potential difference (CSP–CSN) input to the current detection circuit 123 with a predetermined gain.

The switch circuit SLSH selects an output voltage of the first amplifier circuit SAA when SHMOD1=H is true. In other words, SHMOD1=H corresponds to an operation mode of using the sample and hold circuit SHC. In contrast, the switch circuit SLSH selects an output voltage of the second amplifier circuit SAB when SHMOD1=L is true. In other words, SHMOD1=L corresponds to an operation mode in which the sample and hold circuit SHC is not used. The switch circuit SLSH outputs the voltage thus selected as the detection voltage DTQ. The switch circuit SLSH is, for example, an analog switch circuit using a transistor.

As shown in FIG. 3, when the PWM signal DCS1 has changed from the low level to the high level, the current ILD starts flowing through the light emitting element 15. On this occasion, since the potential difference between the both ends of the first resistor RCS changes rapidly, there occurs a delay until the detection voltage DTQ of the current detection circuit 123 reaches the correct voltage. For example, due to a parasitic capacitance on an output node of the current detection circuit 123 and so on, there occurs a delay until the detection voltage DTQ reaches the correct voltage.

This delay causes an error in the output voltage ERQ of the error amplifier circuit 124. However, when the PWM signal DCS1 has the high duty ratio, since the detection voltage DTQ is set to the correct voltage in most part of the period in which the PWM signal DCS1 is in the high level, the influence of the error is small. Therefore, in a high duty-ratio mode, the sample and hold function is disabled. In contrast, when the PWM signal DCS1 has the low duty ratio, the proportion of the delay described above to the period in which the PWM signal DCS1 is in the high level becomes high. Therefore, in a low duty-ratio mode, the sample and hold function is enabled. Since the sample and hold operation is performed immediately before the PWM signal DCS1 changes from the high level to the low level, it is expected that the detection voltage DTQ is set to the correct voltage at that timing. Thus, it becomes possible to perform the correct current detection without being affected by the delay described above.

Figure 7:
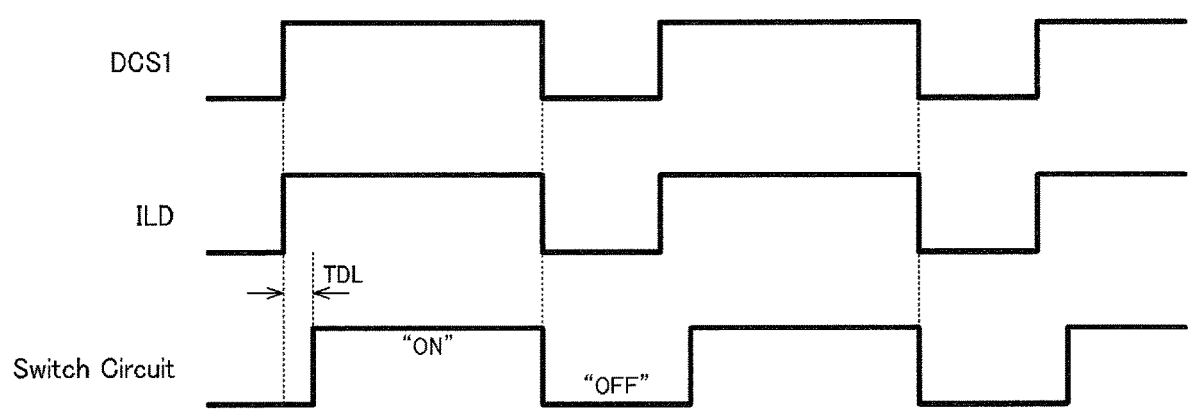
FIG. 7 is a waveform chart when a masking operation is enabled.

Then, the masking operation will be described. FIG. 7 is a waveform chart when a masking operation is enabled.

When the PWM signal DCS1 is in the high level, the current flowing through the light emitting element 15 satisfies ILD>0, and when the PWM signal DCS1 is in the low level, the current flowing through the light emitting element 15 satisfies ILD=0. When SHMOD1=L is true, the switch circuit 125 changes from the OFF state to the ON state to output the output voltage ERQ of the error amplifier circuit 124 when a masking period TDL has elapsed after the PWM signal DCS1 has changed from the low level to the high level. When the PWM signal DCS1 changes from the high level to the low level, the switch circuit 125 changes from the ON state to the OFF state at the same time. For example, the switch circuit 125 includes a delay circuit having a delay time equal to TDL, and an AND circuit for outputting an AND signal of the output signal of the delay circuit and the PWM signal DCS1. Then, the ON/OFF state of the switch circuit 125 is controlled in accordance with the AND signal. It should be noted that when the switch circuit 125 is in the OFF state, the voltage of the output node of the switch circuit 125 is held by an external capacitor not shown or the like.

As described above, when the PWM signal DCS1 changes from the low level to the high level, the delay occurs until the detection voltage DTQ reaches the correct voltage. The masking period TDL is set longer than the delay time in advance. Thus, in the period in which the detection voltage DTQ is not the correct voltage, the output voltage ERQ of the error amplifier circuit 124 is masked. Thus, it becomes possible to perform the correct current detection, and thus, it is possible to improve the accuracy of the switching regulation control.

When SHMOD1=H is true, the masking operation is disabled. In other words, when the PWM signal DCS1 changes from the low level to the high level, the switch circuit 125 changes from the OFF state to the ON state at the same time. As described with reference to FIG. 5 and so on, when SHMOD1=H is true, since the current detection circuit 123 performs the sample and hold operation immediately before the falling edge of the PWM signal DCS1, the incorrect detection voltage DTQ appearing when the PWM signal DCS1 changes from the low level to the high level is not output. Therefore, there is no need to perform the masking operation.

Then, the gate elongation will be described. When SHMOD1=H is true, namely the PWM signal DCS1 has the low duty ratio, the control signal output circuit 121 outputs the control signal GTA and the second control signal GTB described with reference to FIG. 4. Specifically, the control signal output circuit 121 changes the control signal GTA from the high level to the low level when the first control signal DRV changes from the high level to the low level. Further, the control signal output circuit 121 changes the second control signal GTB from the high level to the low level when a predetermined period has elapsed after the first control signal DRV has changed from the high level to the low level.

When SHMOD1=L is true, namely the PWM signal DCS1 has the high duty ratio, the control signal output circuit 121 outputs the control signal GTA and the second control signal GTB described with reference to FIG. 3. Specifically, the control signal output circuit 121 sets the control signal GTA and the second control signal GTB to the low level when the first control signal DRV changes from the high level to the low level.

Figure 8:
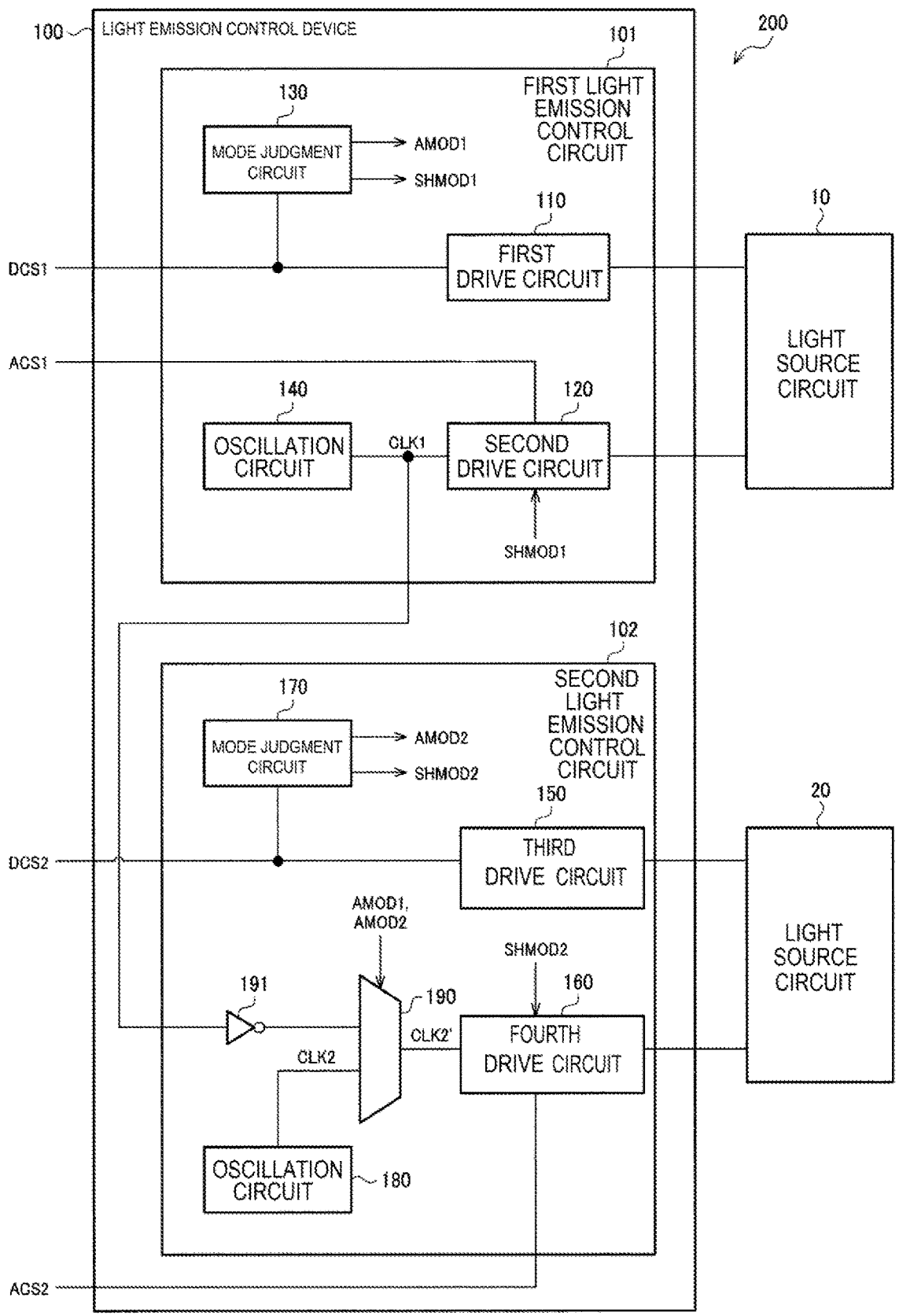
FIG. 8 is a diagram showing a second configuration example of the light source device.

Then, an example of operation control using AMOD1, namely an example of operation control corresponding to the dimming mode, will be described. FIG. 8 shows a second configuration example of the light source device 200. In the second configuration example, the light emission control device 100 controls two light source circuits 10, 20.

The light source device 200 shown in FIG. 8 includes the light emission control device 100, the light source circuit 10, and the light source circuit 20. The light emission control device 100 includes a first light emission control circuit 101 and a second light emission control circuit 102. It should be noted that in FIG. 8, the illustration of terminals provided to the light emission control device 100 is omitted.

The configuration and the operation of the light source circuit 10 and the first light emission control circuit 101 are as described with reference to FIG. 1 and so on. Since the light source circuit 20 has substantially the same configuration as that of the first light source circuit 10, the description thereof will be omitted. The second light emission control circuit 102 has basically the same configuration as that of the first light emission control circuit 101, but has a configuration in which the clock signal used for the switching regulation control is selected in accordance with the dimming mode. The second light emission control circuit 102 will hereinafter be described.

The second light emission control circuit 102 includes a third drive circuit 150, a fourth drive circuit 160, a mode judgment circuit 170, an oscillation circuit 180, a selector 190, and an inverter 191.

The third drive circuit 150 outputs a third control signal for controlling a third switching element of the light source circuit 20 to be switched ON or OFF based on a PWM signal DCS2. The operation of the third drive circuit 150 is substantially the same as that of the first drive circuit 110. Specifically, the third switching element corresponds to the first switching element 11 shown in FIG. 1, and the third control signal corresponds to the first control signal DRV shown in FIG. 1.

The fourth drive circuit 160 outputs a fourth control signal for controlling a fourth switching element of the light source circuit 20 to be switched ON or OFF based on a dimming voltage ACS2, the PWM signal DCS2, and a clock signal CLK2'. The operation of the fourth drive circuit 160 is substantially the same as that of the second drive circuit 120. Specifically, the fourth switching element corresponds to the second switching element 12 shown in FIG. 1, and the fourth control signal corresponds to the second control signal GTB shown in FIG. 1.

The mode judgment circuit 170 outputs a dimming mode judgment signal AMOD2 and a duty judgment signal SHMOD2 based on the PWM signal DCS2. The operation of the mode judgment circuit 170 is substantially the same as that of the mode judgment circuit 130. In other words, the truth table of AMOD2 and SHMOD2 is substantially the same as that of AMOD1 and SHMOD1 described with reference to FIG. 5. It should be noted that since the duty ratios of the PWM signal DCS1 and the PWM signal DCS2 are arbitrary, the mode judgment circuit 130 and the mode judgment circuit 170 can also be different in mode judgment result from each other.

The oscillation circuit 180 generates a clock signal CLK2. The inverter 191 inverts the logic level of the clock signal CLK1. The selector 190 selects one of the inversion signal of the clock signal CLK1 and the clock signal CLK2 based on the dimming mode judgment signals AMOD1, AMOD2, and then outputs the result as the clock signal CLK2'.

Figures 9, 10:
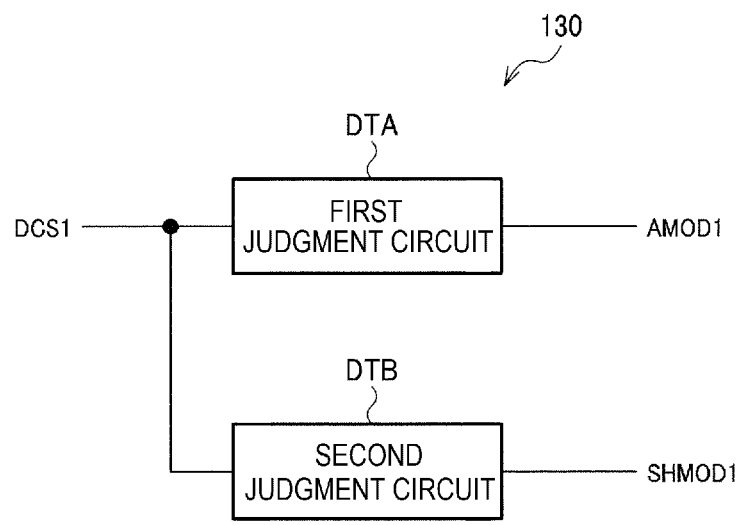
FIG. 9 is a diagram for explaining an operation of a selector.
FIG. 10 is a diagram showing a detailed configuration example of the mode judgment circuit.

FIG. 9 is a diagram for explaining the operation of the selector 190. When AMOD1=AMOD2=H is true, the selector 190 outputs the inversion signal of the clock signal CLK1 as the clock signal CLK2'. In FIG. 9, the inversion signal is expressed by attaching a bar above the characters of CLK1. When AMOD1=AMOD2=H is false, the selector 190 outputs the clock signal CLK2 as the clock signal CLK2'.

When AMOD1=AMOD2=H is true, namely when the first light emission control circuit 101 and the second light emission control circuit 102 are both in the analog dimming mode, the clock signal CLK1 and the clock signal CLK2' become opposite in phase to each other. In other words, the second control signal for performing the switching regulation control on the light source circuit 10 and the fourth control signal for performing the switching regulation control on the light source circuit 20 become opposite in phase to each other.

The analog dimming mode is used when dimming the light emitting element so as to have high luminance. In other words, the analog dimming mode is a mode in which the current flowing through the light emitting element is high. As shown in FIG. 2, in the current flowing through the light emitting element, there exists a ripple due to the switching regulation control. If the switching regulation control of the light source circuits 10, 20 is performed in the same phase, it results in that the maximum current of the ripple occurs at the same time. In such a case, the maximum load on the power supply circuit for supplying the power to the light source circuit 20 increases. In this regard, since in the present embodiment, the switching regulation control of the light source circuits 10, 20 is performed in the phases opposite to each other, it is possible to shift the timings when the maximum current of the ripple occurs. Thus, the maximum load on the power supply circuit can be reduced.

3. Detailed Configuration Example of Mode Judgment Circuit

FIG. 10 shows a detailed configuration example of the mode judgment circuit 130. It should be noted that the mode judgment circuit 170 has substantially the same configuration. As shown in FIG. 10, the mode judgment circuit 130 includes a first judgment circuit DTA for outputting the dimming mode judgment signal AMOD1 based on the PWM signal DCS1, and a second judgment circuit DTB for outputting the duty ratio judgment signal SHMOD1 based on the PWM signal DCS1.

Figure 11:
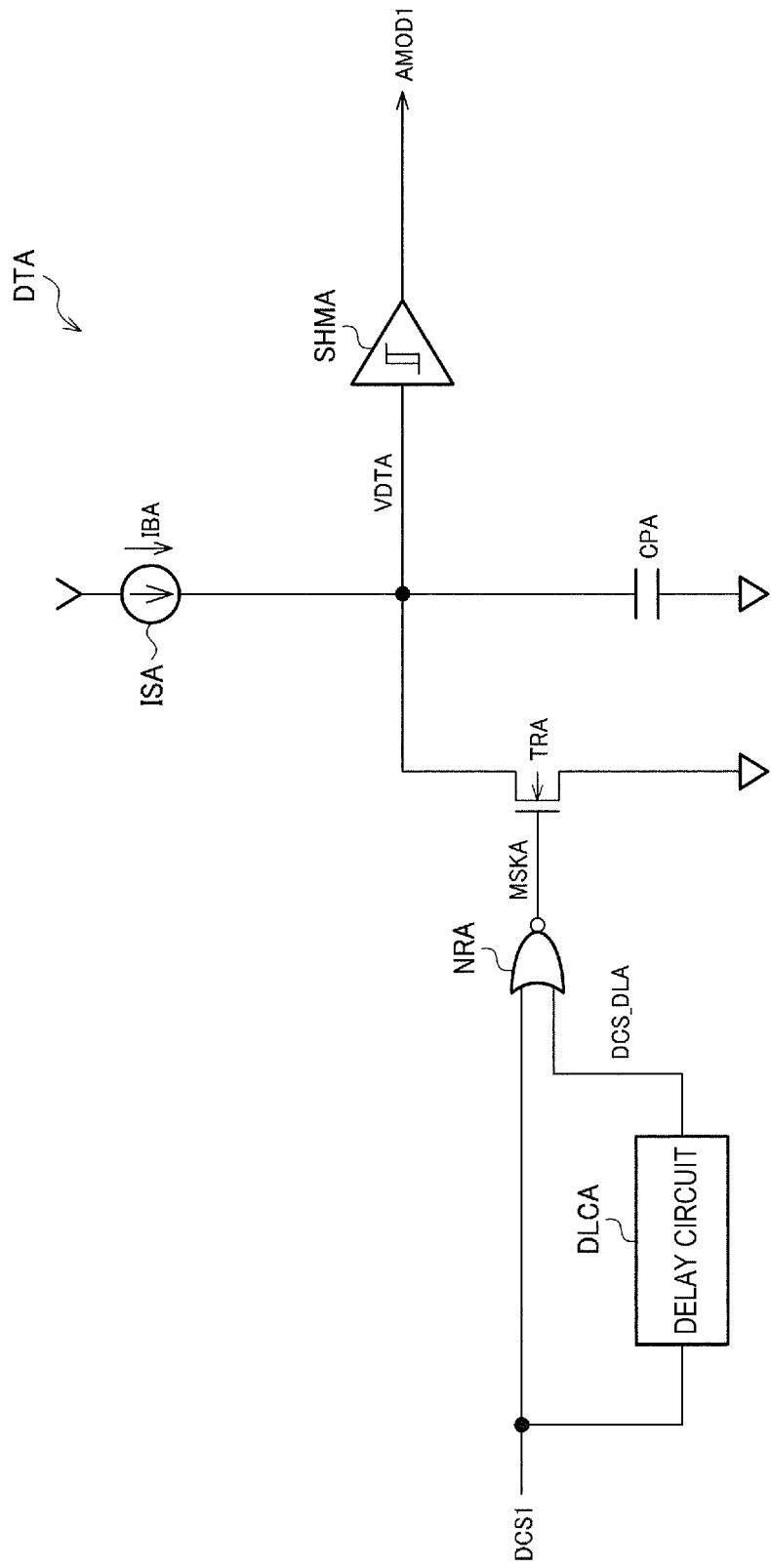
FIG. 11 is a diagram showing a detailed configuration example of a first judgment circuit.

FIG. 11 shows a detailed configuration example of the first judgment circuit DTA. The first judgment circuit DTA includes a delay circuit DLCA, a NOR circuit NRA, a transistor TRA, a current source ISA, a capacitor CPA, and a buffer circuit SHMA.

One end of the capacitor CPA is coupled to the second power supply node. The second power supply node is, for example, a ground node. The current source ISA is coupled to the other end of the capacitor CPA to supply the capacitor CPA with a current IBA. The transistor TRA is an N-type transistor, and is coupled between the other end of the capacitor CPA and the second power supply node. In other words, the source of the transistor TRA is coupled to the second power supply node, and the drain of the transistor TRA is coupled to the other end of the capacitor CA. The voltage of the other end of the capacitor CA is denoted by VDTA. The buffer circuit SHMA outputs the dimming mode judgment signal AMOD1 in the first logic level or the second logic level in accordance with whether or not the voltage VDTA is higher than a threshold voltage. The threshold voltage is a so-called logical threshold. The buffer circuit SHMA is, for example, a Schmitt circuit.

Figure 12:
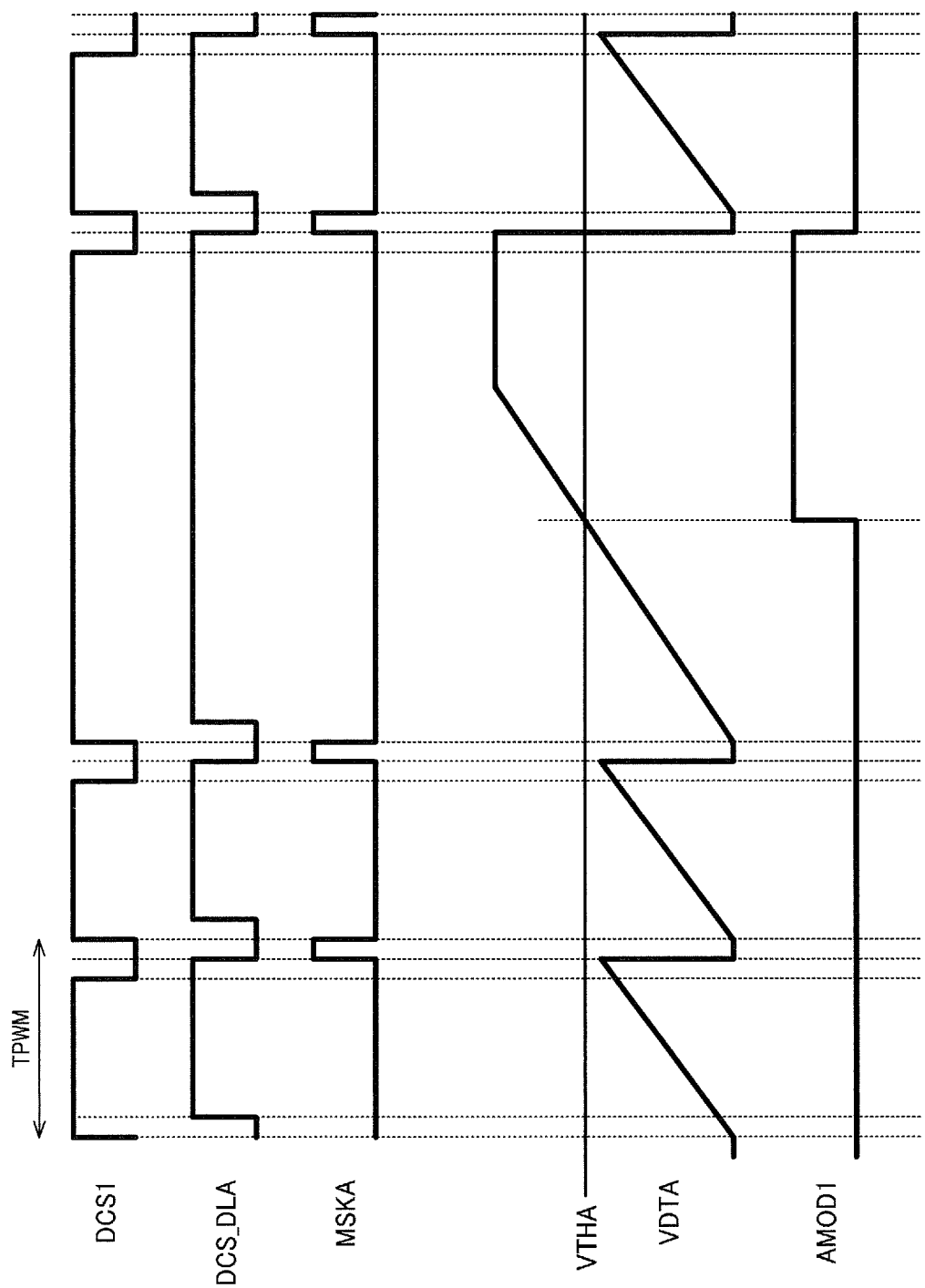
FIG. 12 is a waveform chart for explaining an operation of the first judgment circuit.

FIG. 12 is a waveform chart for explaining an operation of the first judgment circuit DTA. In FIG. 12, the first logic level is assumed as the low level, the second logic level is assumed as the high level, and the second power supply is assumed as the ground.

The delay circuit DLCA outputs a signal DCS_DLA obtained by delaying the PWM signal DCS1. The delay time is sufficiently shorter than the cycle length TPWM of the PWM signal DCS1. The NOR circuit NRA outputs negative OR of the PWM signal DCS1 and the signal DCS_DLA as a masking signal MSKA. When the PWM signal DCS1 is in the low level, the masking signal MSKA is basically set to the high level, but the rising edge of the masking signal MSKA is delayed as much as the delay time due to the delay circuit DLCA.

When the masking signal MSKA is in the high level, the transistor TRA is in the ON state, and therefore, the voltage VDTA of the other end of the capacitor CPA is set to the ground. When the masking signal MSKA is set to the low level, the transistor TRA is set to the OFF state, and the current IBA is supplied to the capacitor CPA. Thus, the voltage VDTA rises. In the case of the PWM dimming mode, since the masking signal MSKA is set to the high level once again, the voltage VDTA returns to the ground. The threshold voltage VTHA of the buffer circuit SHMA is set so as not to exceed the maximum value of the voltage VDTA on this occasion. In other words, in the PWM dimming mode, the dimming mode judgment signal AMOD1 is kept in the low level.

In the case of the analog dimming mode, the PWM signal DCS1 is kept in the high level for a longer period than the cycle length TPWM. On this occasion, since the voltage VDTA exceeds the threshold voltage VTHA, the dimming mode judgment signal AMOD1 changes from the low level to the high level. When the PWM dimming mode is set once again, and the PWM signal DCS1 changes to the low level, the masking signal MSKA is set to the high level, and the dimming mode judgment signal AMOD1 is set to the low level. In such a manner as described above, the analog dimming mode and the PWM dimming mode are detected based on the length of the active period of the PWM signal DCS1.

Figure 13:
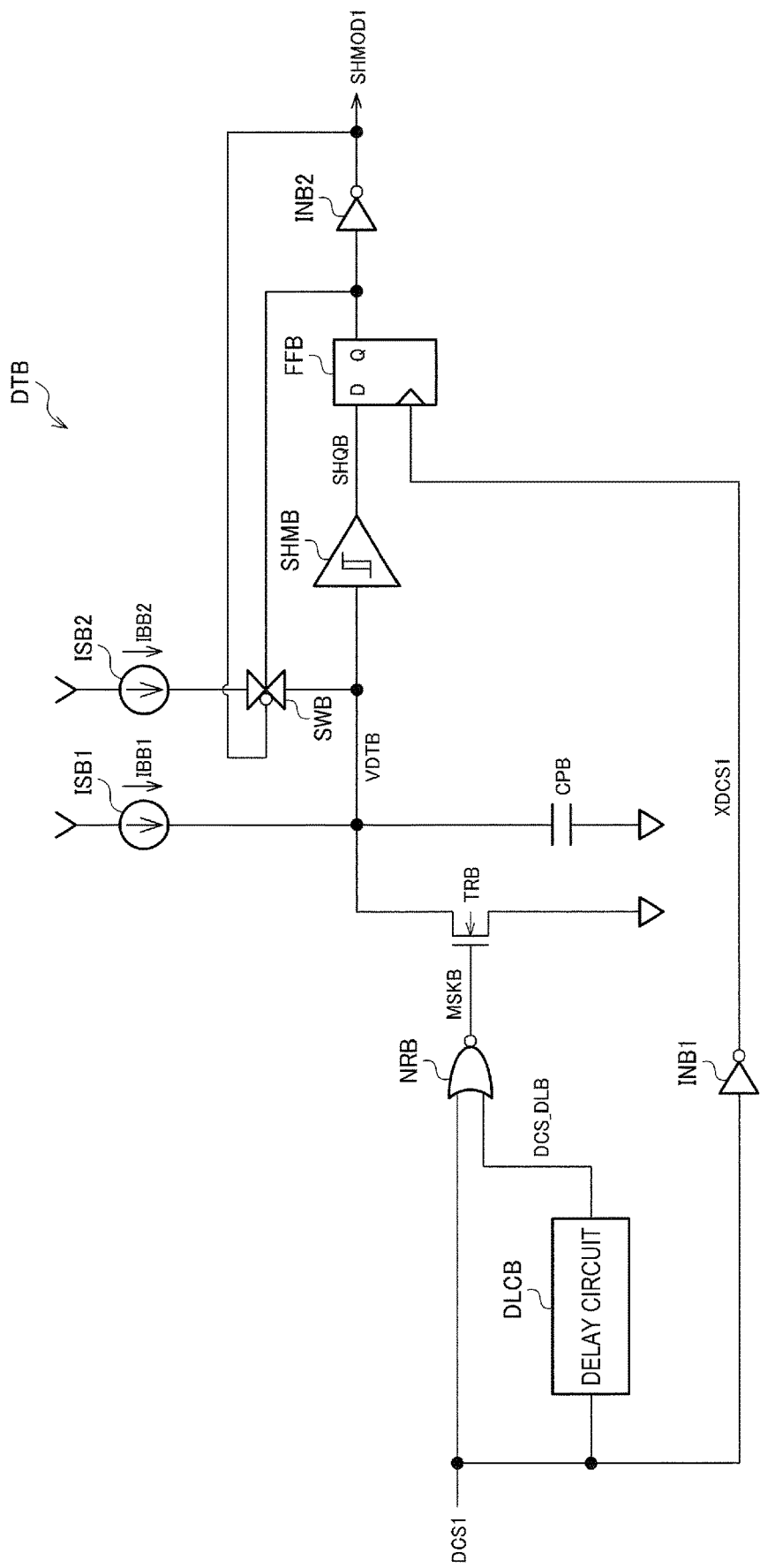
FIG. 13 is a diagram showing a detailed configuration example of a second judgment circuit.

FIG. 13 shows a detailed configuration example of the second judgment circuit DTB. The second judgment circuit DTB includes a delay circuit DLCB, a NOR circuit NRB, a transistor TRB, current sources ISB1, ISB2, a capacitor CPB, a buffer circuit SHMB, a switch SWB, a latch circuit FFB, and inverters INB1, INB2.

Since the transistor TRB, the current source ISB1, the capacitor CPB, and the buffer circuit SHMB are substantially the same in configuration as the transistor TRA, the current source ISA, the capacitor CPA, and the buffer circuit SHMA shown in FIG. 11, respectively, the description thereof will be omitted. The switch SWB is, for example, a transfer gate. One end of the capacitor CPB is coupled to the second power supply node. When the switch SWB is in the ON state, the current source ISB1 is coupled to the other end of the capacitor CPB to supply the capacitor CPB with a current IBB2. The latch circuit FFB latches an output signal SHQB of the buffer circuit SHMB with an edge of a signal XDCS1 obtained by performing logic inversion on the PWM signal DCS1. The inverter INB2 performs logic inversion on the output signal of the latch circuit FFB and then outputs the result as the duty ratio judgment signal SHMOD1.

Figure 14:
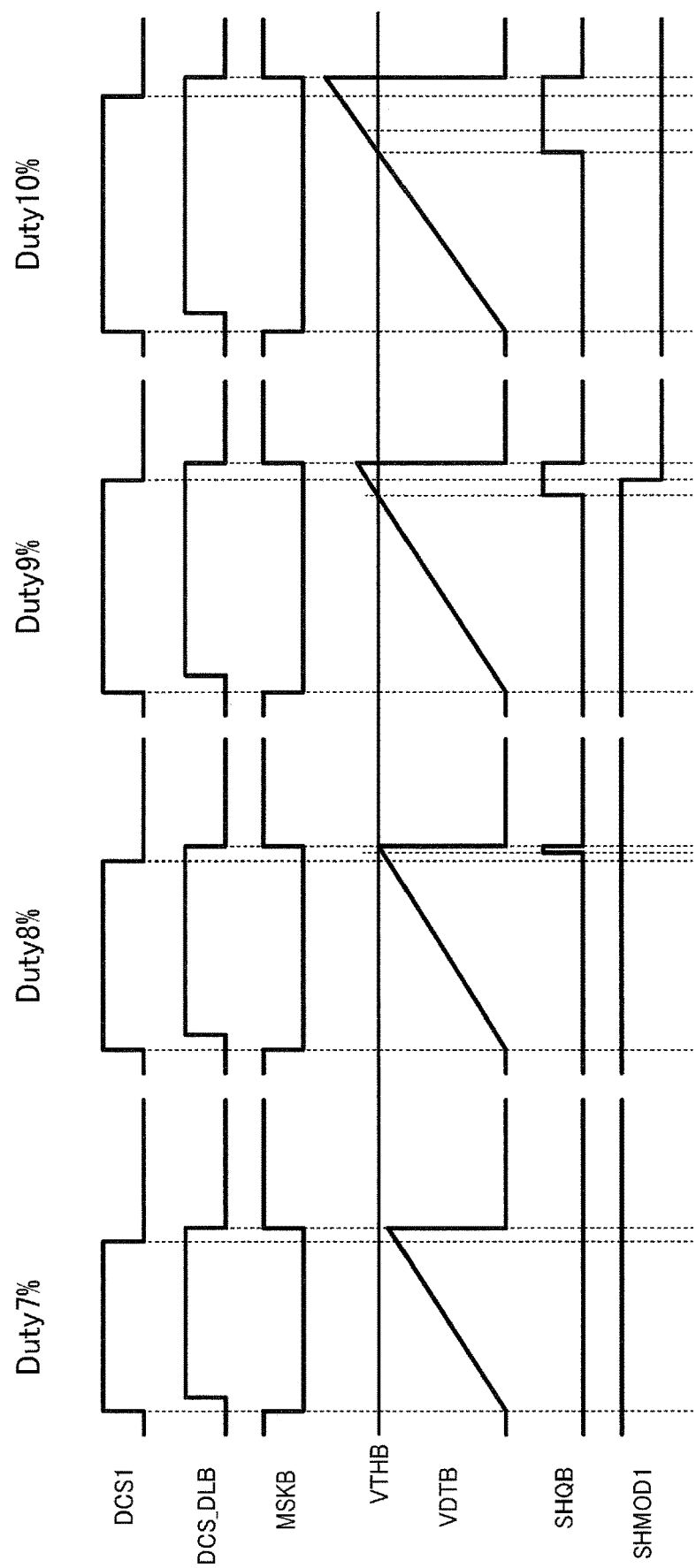
FIG. 14 is a waveform chart for explaining an operation of the second judgment circuit.
Figure 15:
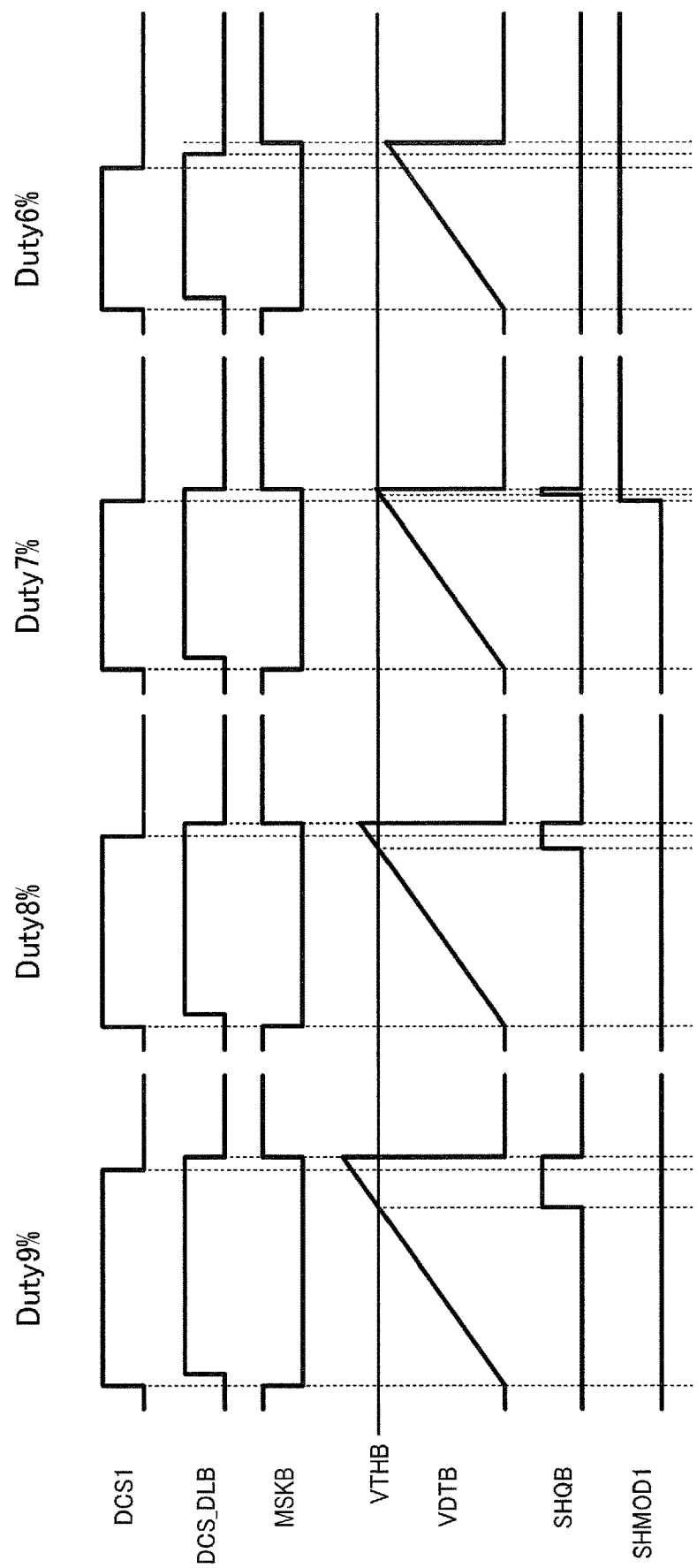
FIG. 15 is a waveform chart for explaining the operation of the second judgment circuit.

FIG. 14 and FIG. 15 are waveform charts for explaining an operation of the second judgment circuit DTB. In FIG. 14 and FIG. 15, the first logic level is assumed as the low level, the second logic level is assumed as the high level, and the second power supply is assumed as the ground. It should be noted that in FIG. 14 and FIG. 15, only the vicinity of the high period is illustrated without illustrating the whole cycle of the PWM signal DCS1.

In FIG. 14, there is shown the waveform chart when the duty ratio of the PWM signal DCS1 is increasing. The masking signal MSKB is generated in substantially the same manner as in the masking signal MSKA. Specifically, the masking signal MSKB changes from the low level to the high level with a delay corresponding to the delay time due to the delay circuit DLCB after the PWM signal DCS1 changes from the high level to the low level.

When the duty ratio judgment signal SHMOD1 is in the high level, since the switch SWB is in the OFF state, only the current IBB1 is supplied to the capacitor CPB. In the period in which the masking signal MSKB is in the low level, the voltage VDTB of the other end of the capacitor CPB is rising. When VDTB≥VTHB is true, the output signal SHQB of the buffer circuit SHMB is set to the high level. VTHB denotes the threshold voltage of the buffer circuit SHMB.

When the duty ratio of the PWM signal DCS1 is no higher than 8%, VDTB<VTHB is true at the timing when the PWM signal DCS1 falls. Since the latch circuit FFB latches the output signal SHQB of the buffer circuit SHMB with the falling edge of the PWM signal DCS1, SHMOD1 is in the high level. In contrast, when the duty ratio of the PWM signal DCS1 is no lower than 9%, since VDTB>VTHB is true at the timing when the PWM signal DCS1 falls, SHMOD1 changes from the high level to the low level.

In FIG. 15, there is shown the waveform chart when the duty ratio of the PWM signal DCS1 is decreasing. When SHMOD1 is in the low level, since the switch SWB is in the ON state, the current IBB1 and the current IBB2 are supplied to the capacitor CPB. Thus, the gradient of the temporal change of the voltage VDTB increases compared to when the duty ratio of the PWM signal DCS1 is increasing.

The circuit operation is as described with reference to FIG. 14. It should be noted that since the gradient of the temporal change of the voltage VDTB has increased, the threshold value for judging the duty ratio has decreased. Specifically, when the duty ratio is no lower than 8%, SHMOD1 is in the low level, and when the duty ratio is no higher than 7%, SHMOD1 is in the high level. By providing such hysteresis, the influence of a noise or the like can be reduced, and thus, the mode judgment result can be stabilized. In such a manner as described above, the operation mode is detected based on the length of the active period of the PWM signal DCS1.

Figure 16:
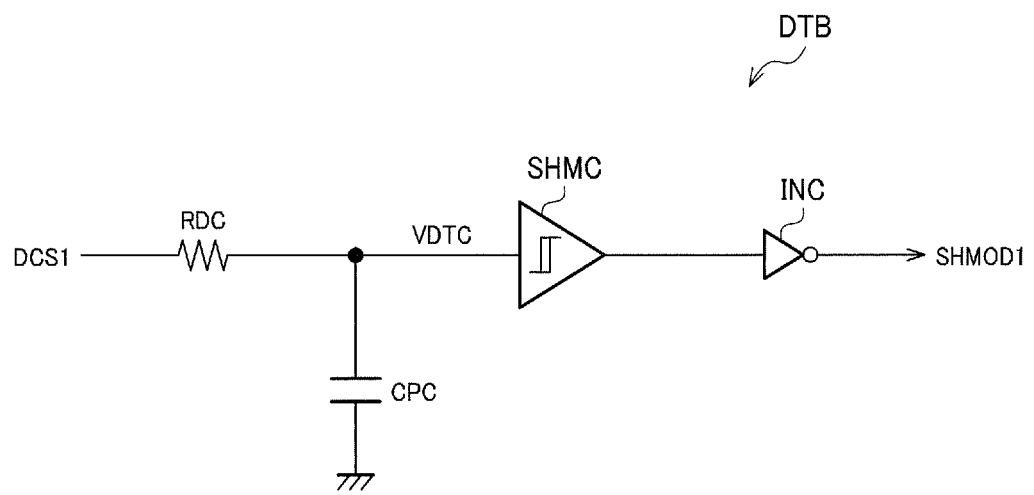
FIG. 16 is a diagram showing a modified example of the second judgment circuit.
Figure 17:
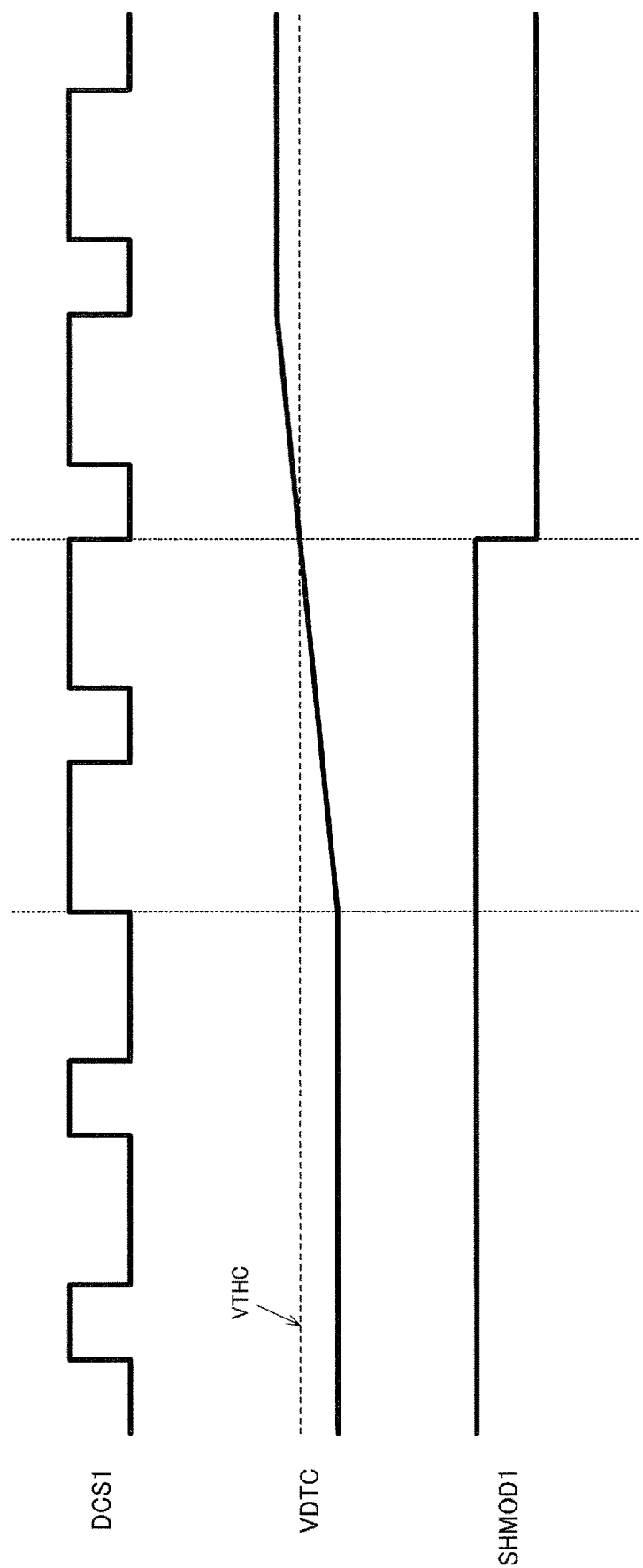
FIG. 17 is a waveform chart for explaining an operation of the modified example of the second judgment circuit.

FIG. 16 shows a modified example of the second judgment circuit DTB. The second judgment circuit DTB shown in FIG. 16 includes a resistor RDC, a capacitor CPC, a buffer circuit SHMC, and an inverter INC. FIG. 17 is a waveform chart for explaining an operation of the modified example of the second judgment circuit DTB.

The resistor RDC and the capacitor CPC constitute a lowpass filter to smooth the PWM signal DCS1. The voltage VDTC thus smoothed is input to the buffer circuit SHMC. The threshold voltage of the buffer circuit SHMC is denoted by VTHC. When the PWM signal DCS1 has the low duty ratio, VDTC<VTHC is true. Therefore, SHMOD1 is set to the high level. When the duty ratio of the PWM signal DCS1 increases, the voltage VDTC increases, and when VDTC≥VTHC becomes true, SHMOD1 changes from the high level to the low level.

For example, the judgment threshold value of the duty ratio is assumed as 10%. On this occasion, the voltage obtained by smoothing the PWM signal DCS1 having the duty ratio of 10% with the lowpass filter and the threshold voltage VTHC of the buffer circuit SHMC are made substantially equal to each other in advance. Thus, SHMOD1=H becomes true when the duty ratio is lower than 10%, and SHMOD1=L becomes true when the duty ratio is no lower than 10%. In such a manner as described above, the operation mode is detected based on the duty ratio of the PWM signal DCS1.

Figure 18:
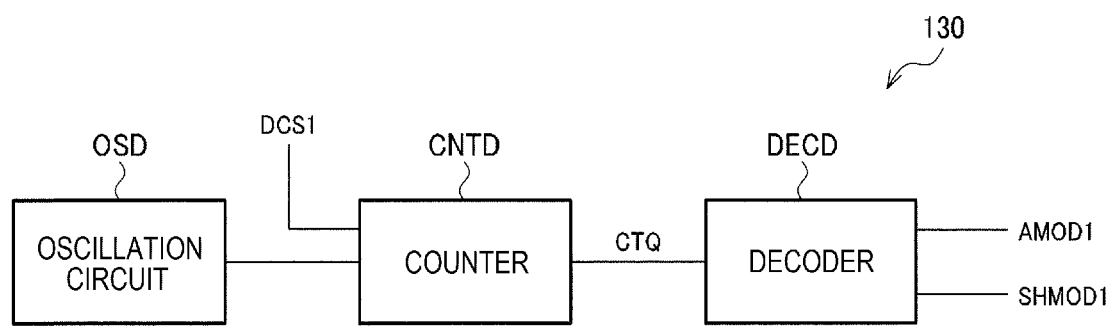
FIG. 18 is a diagram showing a modified example of the mode judgment circuit.
Figure 19:
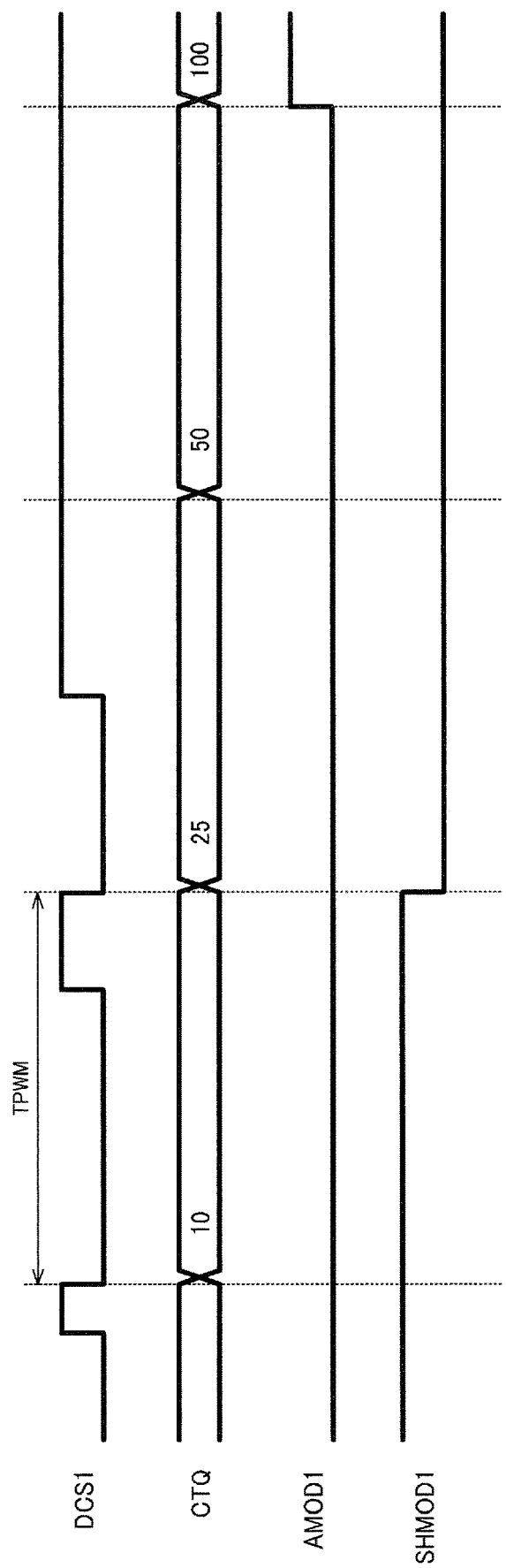
FIG. 19 is a waveform chart for explaining an operation of the modified example of the mode judgment circuit.

FIG. 18 shows a modified example of the mode judgment circuit 130. The mode judgment circuit 130 shown in FIG. 18 includes an oscillation circuit OSD, a counter CNTD, and a decoder DECD. FIG. 19 is a waveform chart for explaining an operation of the modified example of the mode judgment circuit 130.

The counter CNTD performs a counting operation with a clock signal generated by the oscillation circuit OSD. The counter CNTD starts counting with the rising edge of the PWM signal DCS1, and latches and then output the count value CTQ with the falling edge of the PWM signal DCS1. In FIG. 19, the cycle length TPWM of the PWM signal DCS1 corresponds to 100 counts. In other words, the count value CTQ has the same numerical value as the percentage expression of the duty ratio. It should be noted that the correspondence between the cycle length TPWM and the count value is not limited to the above.

The decoder DECD outputs the dimming mode judgment signal AMOD1 and the duty ratio judgment signal SHMOD1 based on the count value CTQ. The decoder DECD outputs AMOD1=L when CTQ<100 is true, and outputs AMOD1=H when CTQ=100 is true. Further, the decoder DECD outputs SHMOD1=H when CTQ≤10 is true, and outputs SHMOD1=L when CTQ>10 is true. In other words, it is assumed here that the duty ratio judgment threshold value is 10%.

4. Projection Type Video Display Device

Figure 20:
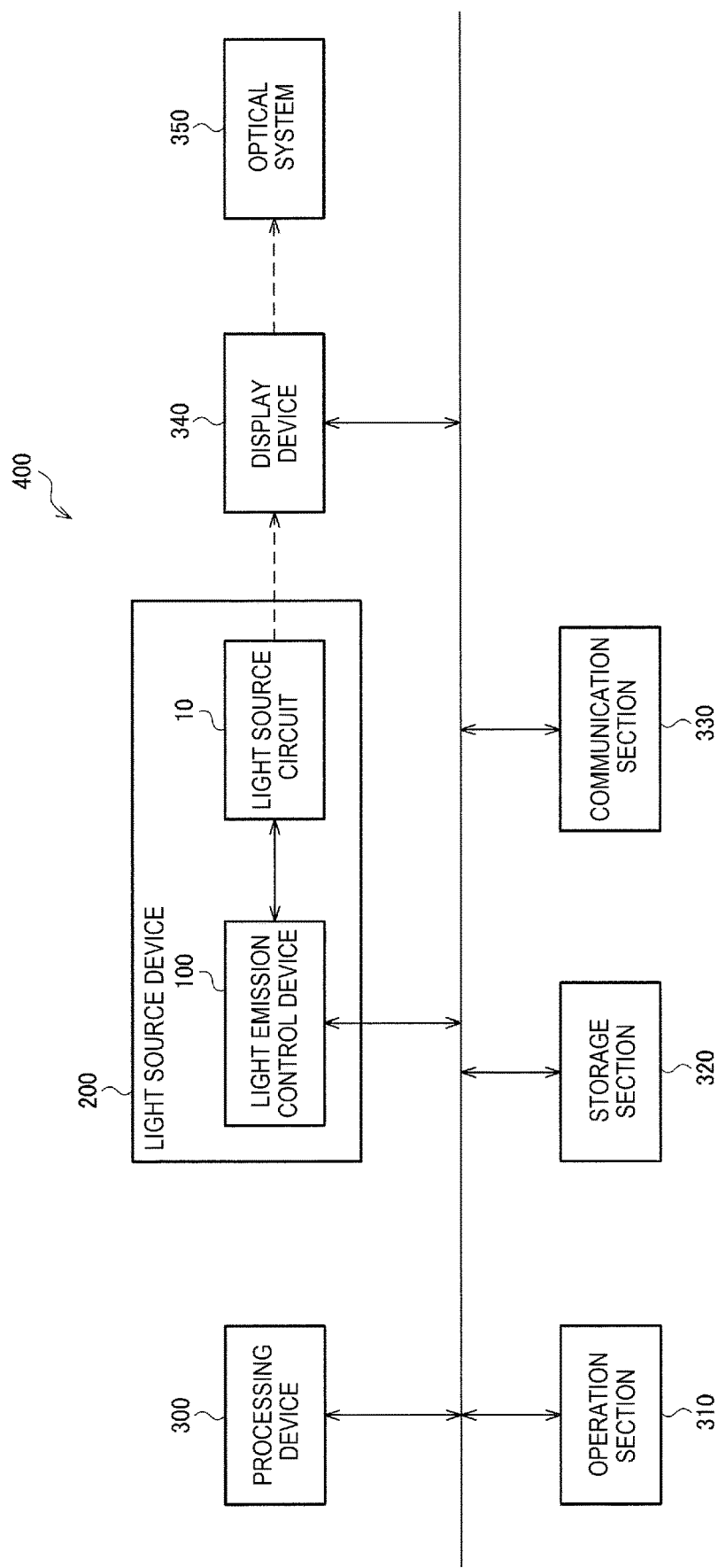
FIG. 20 is a diagram showing a configuration example of a projection type video display device.

FIG. 20 shows a configuration example of a projection type video display device 400 including the light source device 200. The projection type video display device 400 is a device for projecting a picture on a screen, and is also called a projector. The projection type video display device 400 includes the light source device 200, a processing device 300, an operation section 310, a storage section 320, a communication section 330, a display device 340, and an optical system 350. The light source device 200 includes the light emission control device 100 and the light source circuit 10.

The communication section 330 performs communication with an information processing device such as a PC. The communication section 330 is a video interface compliant with a variety of standards such as the VGA standard, the DVI standard, or the HDMI standard (HDMI is a registered trademark). Alternatively, the communication section 330 can be a communication interface compliant with the USB standard or the like, or can also be a network interface such as LAN. The storage section 320 stores image data input from the communication section 330. Further, the storage section 320 can also function as a working memory of the processing device 300. The storage section 320 is a variety of storage devices such as a semiconductor memory or a hard disk drive. The operating section 310 is a user interface for the user to operate the projection type video display device 400. For example, the operation section 310 corresponds to buttons, a touch panel, a pointing device, or a character input device. The processing device 300 is a processor such as a CPU or an MPU. The processing device 300 transmits the image data stored in the storage section 320 to the display device 340. Further, the processing device 300 outputs the PWM signal and the dimming voltage to the light emission control device 100 to thereby perform the dimming control. The display device 340 includes a liquid crystal display panel and a display driver for making the liquid crystal display panel display an image based on the image data. The light enters the liquid crystal panel from the light source circuit 10, and the light transmitted through the liquid crystal panel is projected on the screen by the optical system 350. In FIG. 20, the path of the light is represented by the dotted arrows.

The light emission control device according to the present embodiment described hereinabove controls the first switching element and the second switching element. The first switching element is disposed in series to the light emitting element between the first power supply node and one end of the inductor. The second switching element is disposed between the other end of the inductor and the second power supply node. The light emission control device includes the PWM terminal, the first drive circuit, the second drive circuit, and the mode judgment circuit. To the PWM terminal, there is input the PWM signal. The first drive circuit outputs the first control signal, and the first control signal sets the first switching element to the ON state when the PWM signal is in the active state, and sets the first switching element to the OFF state when the PWM signal is in the inactive state. The second drive circuit outputs the second control signal, and the second control signal controls the ON/OFF state of the second switching element when the PWM signal is in the active state. The mode judgment circuit judges between the PWM dimming mode as the dimming mode using the first control signal, and the analog dimming mode as the dimming mode using the second control signal based on the PWM signal.

According to the present embodiment, since the dimming mode is judged based on the PWM signal input to the PWM terminal, the dimming mode can be judged inside the light emission control device without receiving the mode signal from the outside of the light emission control device. Thus, it becomes possible for the light emission control device to judge the dimming mode without increasing the number of terminals or the circuit size.

Further, in the present embodiment, it is also possible for the mode judgment circuit to judge the length of the active period of the PWM signal or the duty ratio of the PWM signal to thereby judge between the PWM dimming mode and the analog dimming mode.

To the PWM terminal, there is input the PWM signal different in duty ratio with the dimming mode. The length of the active period of the PWM signal varies in accordance with the duty ratio of the PWM signal. Therefore, it is possible for the mode judgment circuit to judge the dimming mode by judging the length of the active period of the PWM signal or the duty ratio of the PWM signal.

Further, in the present embodiment, it is possible to have a plurality of modes corresponding to the length of the active period of the PWM signal in the PWM dimming mode. It is also possible for the mode judgment circuit to judge the length of the active period of the PWM signal to thereby judge what operation mode is currently set out of the plurality of operation modes.

To the PWM terminal, there is input the PWM signal different in duty ratio with the operation mode. The length of the active period of the PWM signal varies in accordance with the duty ratio of the PWM signal. Therefore, it is possible for the mode judgment circuit to judge the operation mode by judging the length of the active period of the PWM signal.

Further, in the present embodiment, it is possible to have a plurality of operation modes corresponding to the duty ratio of the PWM signal in the PWM dimming mode. It is possible for the mode judgment circuit to judge what operation mode is currently set out of the plurality of operation modes by judging the duty ratio of the PWM signal.

To the PWM terminal, there is input the PWM signal different in duty ratio with the operation mode. Therefore, it is possible for the mode judgment circuit to judge the operation mode by judging the duty ratio of the PWM signal.

Further, in the present embodiment, it is also possible for the light emission control device to include the current detection circuit for detecting the current flowing through the light emitting element. It is also possible for the second drive circuit to output the second control signal based on the detection result of the current detection circuit. It is also possible for the plurality of operation modes to include the first operation mode and the second operation mode of the current detection circuit.

According to the present embodiment, it is possible for the mode judgment circuit to judge between the first operation mode and the second operation mode of the current detection circuit by judging the length of the active period of the PWM signal or the duty ratio of the PWM signal.

Further, in the present embodiment, it is also possible to dispose the first resistor in series to the light emitting element and the first switching element between the first power supply node and one end of the inductor. It is also possible for the current detection circuit to have the sample and hold circuit for sampling and holding the potential difference between the both ends of the first resistor, the first amplifier circuit for amplifying the output voltage of the sample and hold circuit, and the second amplifier circuit for amplifying the potential difference between the both ends of the first resistor. It is also possible for the current detection circuit to have the switch circuit for outputting the output voltage of the first amplifier circuit as the detection result in the first operation mode, and outputting the output voltage of the second amplifier circuit as the detection result in the second operation mode.

By adopting such a configuration, the operation of the current detection circuit is controlled in accordance with the mode judged by the mode judgment circuit. In other words, it is possible to control the operation of the current detection circuit as an internal operation of the light emission control device in accordance with the mode judgment result without receiving the mode judgment signal from the outside of the light emission control device.

Further, in the present embodiment, it is also possible for the light emission control device to include the current detection circuit for detecting the current flowing through the light emitting element. It is also possible for the second drive circuit to output the second control signal based on the detection result of the current detection circuit. It is also possible for the plurality of operation modes to include the first operation mode and the second operation mode of the second drive circuit. It is also possible for the second drive circuit to perform the masking operation for masking the detection result of the current detection circuit in the masking period after the PWM signal changes from the inactive state to the active state in the second operation mode, and not to perform the masking operation in the first operation mode.

By adopting such a configuration, the masking operation of the second drive circuit is controlled in accordance with the mode judged by the mode judgment circuit. In other words, it is possible to control the masking operation of the second drive circuit as an internal operation of the light emission control device in accordance with the mode judgment result without receiving the mode judgment signal from the outside of the light emission control device.

Further, in the present embodiment, it is also possible for the plurality of operation modes to include the first operation mode and the second operation mode of the second drive circuit. It is also possible for the second drive circuit to output the second control signal for setting the second switching element to the OFF state when the first switching element changes from the ON state to the OFF state in the first operation mode. It is also possible for the second drive circuit to output the second control signal for keeping the second switching element in the ON state in a predetermined period after the first switching element changes from the ON state to the OFF state in the second operation mode.

It is assumed that the operation of keeping the second switching element in the ON state in the predetermined period after the first switching element changes from the ON state to the OFF state in the second operation mode is called a gate elongation operation. According to the present embodiment, the gate elongation operation of the second drive circuit is controlled in accordance with the mode judged by the mode judgment circuit. In other words, it is possible to control the gate elongation operation of the second drive circuit as an internal operation of the light emission control device in accordance with the mode judgment result without receiving the mode judgment signal from the outside of the light emission control device.

Further, in the present embodiment, it is also possible for the plurality of operation modes to include the first operation mode and the second operation mode. It is also possible for the mode judgment circuit to judge that the operation is performed in the first operation mode when the length of the active period of the PWM signal is shorter than the threshold value, and judge that the operation is performed in the second operation mode when the length of the active period of the PWM signal is longer than the threshold value.

By adopting such a configuration, it is possible for the mode judgment circuit to judge the operation mode based on the length of the active period of the PWM signal. Specifically, it is possible for the mode judgment circuit to judge the operation mode by judging whether or not the length of the active period of the PWM signal is longer than the threshold value.

Further, in the present embodiment, it is also possible for the plurality of operation modes to include the first operation mode and the second operation mode. It is also possible for the mode judgment circuit to judge that the operation is performed in the first operation mode when the duty ratio of the PWM signal is lower than the threshold value, and judge that the operation is performed in the second operation mode when the duty ratio of the PWM signal is higher than the threshold value.

By adopting such a configuration, it is possible for the mode judgment circuit to judge the operation mode based on the duty ratio of the PWM signal. Specifically, it is possible for the mode judgment circuit to judge the operation mode by judging whether or not the duty ratio of the PWM signal is higher than the threshold value.

Further, in the present embodiment, it is also possible for the mode judgment circuit to have the capacitor having one end coupled to the second power supply node, the current source coupled to the other end of the capacitor to supply the capacitor with the current, and the transistor coupled between the other end of the capacitor and the second power supply node and changing from the ON state to the OFF state when the PWM signal changes from the inactive state to the active state. It is also possible for the mode judgment circuit to have the buffer circuit for outputting the signal in the first logic level when the voltage of the other end of the capacitor is lower than the threshold voltage, and outputting the signal in the second logic level when the voltage of the other end of the capacitor is higher than the threshold voltage.

According to the present embodiment, when the transistor is in the OFF state, the capacitor is charged by the current from the current source, and the voltage of the other end of the capacitor is rising. When the transistor is set to the ON state, the other end of the capacitor is coupled to the second power supply node via the transistor, and the charge of the capacitor is reset. The time until the charge of the capacitor is reset is determined by the duty ratio of the PWM signal, namely the active period of the PWM signal. Therefore, the maximum voltage of the other end of the capacitor varies in accordance with the duty ratio of the PWM signal. It is possible to judge whether or not the duty ratio of the PWM signal is higher than the threshold value in accordance with whether the voltage described above exceeds the threshold voltage of the buffer circuit.

Further, in the present embodiment, it is also possible for the light emission control device to include the dimming voltage input terminal to which the dimming voltage for dimming the light emitting element in the second dimming mode is input. It is possible for the second drive circuit to perform the switching regulation control of outputting the second control signal to the second switching element so that the current corresponding to the dimming voltage flows through the light emitting element in the period in which the PWM signal is in the active state. The PWM dimming mode can also be the dimming mode in which the amount of light emitted by the light emitting element is set by the pulse width of the PWM signal. The analog dimming mode can also be the dimming mode in which the PWM signal is fixed to the active state, and the amount of light emitted by the light emitting element is set by the voltage value of the dimming voltage.

As described above, the PWM signal is fixed to the active state in the analog dimming mode, and the amount of light emitted from the light emitting element is set by the pulse width of the PWM signal in the PWM dimming mode. In other words, the duty ratio of the PWM signal is different between the analog dimming mode and the PWM dimming mode. By using the above, it is possible for the mode judgment circuit to judge the dimming mode based on the PWM signal.

Further, the light source device according to the present embodiment includes any one of the light emission control devices described above, the light emitting element, the first switching element, and the second switching element.

Further, the light source device according to the present embodiment includes the light emitting element to electrically be coupled between the first power supply node and the first node, the first switching element electrically coupled in series to the light emitting element between the first power supply node and the first node, the inductor electrically coupled between the first node and the second node, and the second switching element electrically coupled between the second node and the second power supply node. Further, the light source device includes the light emission control device for outputting the first control signal to the first switching element, and outputting the second control signal to the second switching element. The light emission control device includes the PWM terminal, the first drive circuit, the second drive circuit, and the mode judgment circuit. To the PWM terminal, there is input the PWM signal. The first drive circuit outputs the first control signal, and the first control signal sets the first switching element to the ON state when the PWM signal is in the active state, and sets the first switching element to the OFF state when the PWM signal is in the inactive state. The second drive circuit outputs the second control signal, and the second control signal controls the ON/OFF state of the second switching element when the PWM signal is in the active state. The mode judgment circuit judges between the PWM dimming mode as the dimming mode using the first control signal, and the analog dimming mode as the dimming mode using the second control signal based on the PWM signal.

Further, the projection type video display device according to the present embodiment includes any one of the light source devices described above.

It should be noted that although the present embodiment is hereinabove described in detail, it should easily be understood by those skilled in the art that it is possible to make a variety of modifications not substantially departing from the novel matters and the advantages of the present disclosure. Therefore, all of such modified examples should be included in the scope of the present disclosure. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the present disclosure. Further, the configurations and the operations of the light emission control circuit, the light emission control device, the light source device, and the projection type video display device are not limited to those described in the present embodiment, but can be implemented with a variety of modifications.

What is claimed is:

1. A light emission control device configured to control a first switching element disposed in series to a light emitting element between a first power supply node and one end of an inductor, and a second switching element disposed between another end of the inductor and a second power supply node, the light emission control device comprising:
  a PWM terminal to which a PWM signal is input;
  a first drive circuit configured to output a first control signal for setting the first switching element to an ON state when the PWM signal is in an active state, and setting the first switching element to an OFF state when the PWM signal is in an inactive state;
  a second drive circuit configured to output a second control signal for controlling an ON/OFF state of the second switching element when the PWM signal is in the active state; and
  a mode judgment circuit configured to judge between a PWM dimming mode as a dimming mode using the first control signal, and an analog dimming mode as a dimming mode using the second control signal based on the PWM signal.

2. The light emission control device according to claim 1, wherein the mode judgment circuit judges between the PWM dimming mode and the analog dimming mode by judging one of a length of the active period of the PWM signal and a duty ratio of the PWM signal.

3. The light emission control device according to claim 1, wherein
a plurality of operation modes corresponding to a length of the active period of the PWM signal is provided in the PWM dimming mode, and
the mode judgment circuit judges what operation mode is currently set out of the plurality of operation modes by judging the length of the active period of the PWM signal.

4. The light emission control device according to claim 1, wherein
a plurality of operation modes corresponding to a duty ratio of the PWM signal in the PWM dimming mode, and
the mode judgment circuit judges what operation mode is currently set out of the plurality of operation modes by judging the duty ratio of the PWM signal.

5. The light emission control device according to claim 3, further comprising:
a current detection circuit configured to detect a current flowing through the light emitting element, wherein
the second drive circuit outputs the second control signal based on a detection result of the current detection circuit, and
the plurality of operation modes included a first operation mode and a second operation mode of the current detection circuit.

6. The light emission control device according to claim 5, further comprising:
a first resistor disposed in series to the light emitting element and the first switching element between the first power supply node and the one end of the inductor, wherein
the current detection circuit includes
a sample and hold circuit configured to sample and hold a potential difference between both ends of the first resistor,
a first amplifier circuit configured to amplify an output voltage of the sample and hold circuit,
a second amplifier circuit configured to amplify the potential difference between the both ends of the first resistor, and
a switch circuit configured to output an output voltage of the first amplifier circuit as the detection result in the first operation mode, and output an output voltage of the second amplifier circuit as the detection result in the second operation mode.

7. The light emission control device according to claim 3, further comprising:
a current detection circuit configured to detect a current flowing through the light emitting element, wherein
the second drive circuit outputs the second control signal based on a detection result of the current detection circuit,
the plurality of operation modes includes a first operation mode and a second operation mode of the second drive circuit, and
the second drive circuit
performs a masking operation of masking the detection result of the current detection circuit in a masking period after the PWM signal changes from the inactive state to the active state in the second operation mode, and
stops performing the masking operation in the first operation mode.

8. The light emission control device according to claim 3, wherein
the plurality of operation modes includes a first operation mode and a second operation mode of the second drive circuit, and
the second drive circuit outputs
the second control signal for setting the second switching element to the OFF state when the first switching element changes from the ON state to the OFF state in the first operation mode, and
the second control signal for keeping the second switching element in the ON state in a predetermined period after the first switching element changes from the ON state to the OFF state in the second operation mode.

9. The light emission control device according to claim 3, wherein
the plurality of operation modes includes a first operation mode and a second operation mode, and
the mode judgment circuit judges that the first operation mode is set when the length of the active period of the PWM signal is shorter than a threshold value, and judges that the second operation mode is set when the length of the active period of the PWM signal is longer than the threshold value.

10. The light emission control device according to claim 4, wherein
the plurality of operation modes includes a first operation mode and a second operation mode, and
the mode judgment circuit judges that the first operation mode is set when the duty ratio of the PWM signal is lower than a threshold value, and judges that the second operation mode is set when the duty ratio of the PWM signal is higher than the threshold value.

11. The light emission control device according to claim 1, wherein
the mode judgment circuit includes
a capacitor having one end coupled to the second power supply node,
a current source coupled to another end of the capacitor to supply the capacitor with a current,
a transistor coupled between the other end of the capacitor and the second power supply node, and changing from an ON state to an OFF state when the PWM signal changes from the inactive state to the active state, and
a buffer circuit configured to output a signal in a first logic level when a voltage of the other end of the capacitor is lower than a threshold voltage, and output a signal in a second logic level when the voltage of the other end of the capacitor is higher than the threshold voltage.

12. The light emission control device according to claim 1, further comprising:
a dimming voltage input terminal to which a dimming voltage for dimming the light emitting element in a second dimming mode, wherein
the second drive circuit performs switching regulation control of outputting the second control signal to the second switching element so that a current corresponding to the dimming voltage flows through the light emitting element in a period in which the PWM signal is in the active state, the PWM dimming mode is a dimming mode in which an amount of light emitted by the light emitting element is set by a pulse width of the PWM signal, and the analog dimming mode is a dimming mode in which the PWM signal is fixed to the active state, and the amount of light emitted by the light emitting element is set by a voltage value of the dimming voltage.

13. A light source device comprising:
the light emission control device according to claim 1;
the light emitting element;
the first switching element; and
the second switching element.

14. A light source device comprising:
a light emitting element electrically coupled between a first power supply node and a first node;
a first switching element electrically coupled in series to the light emitting element between the first power supply node and the first node;
an inductor electrically coupled between the first node and a second node;
a second switching element electrically coupled between the second node and a second power supply node; and
a light emission control device configured to output a first control signal to the first switching element, and output a second control signal to the second switching element, wherein the light emission control device includes
a PWM terminal to which a PWM signal is input,
a first drive circuit configured to output the first control signal for setting the first switching element to an ON state when the PWM signal is in an active state, and setting the first switching element to an OFF state when the PWM signal is in an inactive state,
a second drive circuit configured to output the second control signal for controlling an ON/OFF state of the second switching element in a period in which the PWM signal is in the active state, and
a mode judgment circuit configured to judge between a PWM dimming mode as a dimming mode using the first control signal, and an analog dimming mode as a dimming mode using the second control signal based on the PWM signal.

15. A projection type video display device comprising:
the light source device according to claim 13.

* * * * *